(12) United States Patent
Matsumi

(10) Patent No.: US 9,530,828 B2
(45) Date of Patent: Dec. 27, 2016

(54) ORGANIC EL DISPLAY UNIT

(71) Applicant: JOLED INC., Tokyo (JP)

(72) Inventor: Tatsuya Matsumi, Tokyo (JP)

(73) Assignee: Joled Inc., Tokyo (JP)

(*) Notice: Subject to any disclaimer, the term of this patent is extended or adjusted under 35 U.S.C. 154(b) by 0 days.

(21) Appl. No.: 14/889,321

(22) PCT Filed: May 7, 2014

(86) PCT No.: PCT/JP2014/062234
§ 371 (c)(1),
(2) Date: Nov. 5, 2015

(87) PCT Pub. No.: WO2014/199745
PCT Pub. Date: Dec. 18, 2014

(65) Prior Publication Data
US 2016/0079327 A1    Mar. 17, 2016

(30) Foreign Application Priority Data

Jun. 12, 2013  (JP) .................................. 2013-123637

(51) Int. Cl.
*H01L 27/32*     (2006.01)
*H01L 51/50*     (2006.01)
*H01L 51/52*     (2006.01)

(52) U.S. Cl.
CPC ....... *H01L 27/3248* (2013.01); *H01L 27/3211* (2013.01); *H01L 27/3244* (2013.01);
(Continued)

(58) Field of Classification Search
CPC  H01L 51/526; H01L 27/3248; H01L 27/3211; H01L 51/5012; H01L 51/5056; H01L 51/5072; H01L 51/5088; H01L 27/32411; H01L 27/3244; H01L 51/5265
See application file for complete search history.

(56) References Cited

U.S. PATENT DOCUMENTS 9,083,000 B2 *   7/2015  Ohsawa .............. H01L 51/5044
2003/0034938 A1   2/2003  Yamada
(Continued)

FOREIGN PATENT DOCUMENTS

JP    2002-367770    12/2002
JP     200712370     1/2007
(Continued)

OTHER PUBLICATIONS

International Search Report received in PCT/JP2014/062234 issued Aug. 19, 2014. 2 pages.

*Primary Examiner* — Benjamin Sandvik
*Assistant Examiner* — Fazli Erdem
(74) *Attorney, Agent, or Firm* — K&L Gates LLP

(57)  ABSTRACT

There is provided an organic EL display unit having superior light emission efficiency and superior display performance. This display unit includes two or more kinds of organic light-emitting devices, each of the organic light-emitting devices having a laminated configuration in which a first electrode layer, an organic layer, and a second electrode layer are laminated in order on a base, and the organic light-emitting devices configured to emit light of different colors. The organic layer includes a common light-emitting layer and an individual light-emitting layer, the common light-emitting layer shared by all of the kinds of organic light-emitting devices, and the individual light-emitting layer provided in only a kind configured to emit specific color light of the kinds of organic light-emitting devices. Some of the kinds of organic light-emitting devices each include a transparent conductive layer between the first electrode layer and the organic layer.

17 Claims, 21 Drawing Sheets

(52) U.S. Cl.
CPC ...... *H01L 51/5012* (2013.01); *H01L 51/5056* (2013.01); *H01L 51/5072* (2013.01); *H01L 51/5088* (2013.01); *H01L 51/5265* (2013.01); *H01L 51/5218* (2013.01); *H01L 2251/308* (2013.01); *H01L 2251/558* (2013.01)

(56) References Cited

U.S. PATENT DOCUMENTS

| | | | |
|---|---|---|---|
| 2007/0102737 A1* | 5/2007 | Kashiwabara | H01L 27/3211 257/291 |
| 2008/0157657 A1 | 7/2008 | Matsunami et al. | |
| 2011/0233576 A1 | 9/2011 | Okutani et al. | |
| 2011/0248247 A1* | 10/2011 | Matsumoto | C09K 11/06 257/40 |
| 2011/0303903 A1* | 12/2011 | Yoshinaga | H01L 51/0056 257/40 |
| 2011/0315963 A1* | 12/2011 | Yoshinaga | C09K 11/06 257/40 |
| 2012/0187386 A1* | 7/2012 | Matsumi | H01L 51/5012 257/40 |
| 2012/0223633 A1* | 9/2012 | Yoshinaga | H01L 27/3211 313/504 |
| 2012/0256208 A1* | 10/2012 | Hatano | H01L 27/3211 257/89 |
| 2012/0274201 A1 | 11/2012 | Seo | |

FOREIGN PATENT DOCUMENTS

| | | |
|---|---|---|
| JP | 2008159778 | 7/2008 |
| JP | 2008300503 | 12/2008 |
| JP | 2009049223 | 3/2009 |
| JP | 2010015747 | 1/2010 |
| JP | 2011204373 | 10/2011 |
| JP | 2012238854 | 12/2012 |

\* cited by examiner

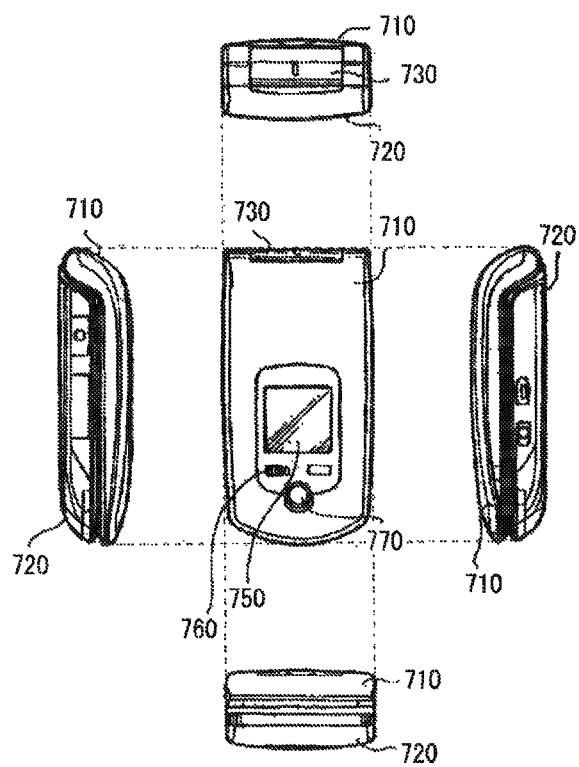

ORGANIC EL DISPLAY UNIT

CROSS REFERENCES TO RELATED APPLICATIONS

The present application is a national stage of International Application No. PCT/JP2014/062234 filed on May 7, 2014 and claims priority to Japanese Patent Application No. 2013-123637 filed on Jun. 12, 2013, the disclosure of which is incorporated herein by reference.

BACKGROUND

The present disclosure relates to an organic EL display unit that emits light with use of an organic electroluminescence (EL) phenomenon.

Typically, a self-luminous device such as an organic light-emitting device includes a first electrode layer, an organic layer including a light-emitting layer, and a second electrode layer in order on a substrate, and is configured to emit light by recombination of electrons and holes that occurs in the light-emitting layer in response to the application of a direct-current voltage between the first electrode layer and the second electrode layer. Although the emitted light may be extracted from the substrate, the emitted light may be extracted from the second electrode layer. Since a circuit including a TFT (Thin Film Transistor) and wiring is formed in the substrate, an aperture ratio is allowed to be improved by extracting light from the second electrode layer disposed opposite to the substrate. In this case, as the first electrode layer, a highly reflective metal electrode is typically used. Moreover, the first electrode layers of adjacent pixels are separated from each other by an insulating film (a bank).

Assuming that the first electrode layer, the organic layer including the light-emitting layer, and the second electrode layer configures one micro-resonator, it is possible to extract more light to outside by adjusting the micro-resonator according to an emission color desired to be emitted so as to have a configuration satisfying the following mathematical expression (1) (for example, refer to Patent Literature 1).

$$2L/\lambda_{max} + \Phi/2\pi = m \quad (1)$$

where L is an optical film thickness of a resonance section of the micro-resonator, $\lambda_{max}$ is a wavelength of light that is to be extracted to outside, $\Phi$ is a phase shift occurring upon reflection at both ends of the resonance section of the micro-resonator, and m is a constant.

The optical film thickness L may change a film thickness of the organic layer for, for example, each color desired to be emitted. At this time, in order to reduce a load on a process apparatus, a layer having a common function is so formed as to be shared by a plurality of pixels, and a layer having a function different for each color such as the light-emitting layer is adjusted by patterning for each color. As a method of the patterning, there is known patterning with use of a vacuum deposition system in which an organic layer is formed in each partitioned pixel through a shadow mask, or patterning with use of printing technology such as ink-jet printing.

CITATION LIST

Patent Literature

Patent Literature 1: Japanese Unexamined Patent Application Publication No. 2002-367770

SUMMARY

Recently, an organic EL display unit having lower power consumption while having superior display performance is desired.

Therefore, it is desirable to provide an organic EL display unit having superior light emission efficiency and superior display performance while having a simple configuration.

An organic EL display unit according to an embodiment of the present disclosure includes two or more kinds of organic light-emitting devices, each of the organic light-emitting devices having a laminated configuration in which a first electrode layer, an organic layer, and a second electrode layer are laminated in order on a base, and the organic light-emitting devices configured to emit light of different colors. The organic layer includes a common light-emitting layer and an individual light-emitting layer, the common light-emitting layer shared by all of the kinds of organic light-emitting devices, and the individual light-emitting layer provided in only a kind configured to emit specific color light of the kinds of organic light-emitting devices. Some of the kinds of organic light-emitting devices each include a transparent conductive layer between the first electrode layer and the organic layer.

In the organic EL display unit according to the embodiment of the present disclosure, the organic layer includes the common light-emitting layer and the individual light-emitting layer; therefore, compared to a case where only the common light-emitting layer is included, light emission efficiency and chromaticity are improved. Moreover, in some of the kinds of organic light-emitting devices, an optical film thickness is adjusted by a thickness of the individual light-emitting layer and a thickness of the transparent conductive layer; therefore, the thickness of the individual light-emitting layer is allowed to be reduced.

In the organic EL display unit according to the embodiment of the present disclosure, while superior display performance is assured by color separation of the light-emitting layer, it is possible to reduce power consumption by decreasing the thickness of the light-emitting layer.

Additional features and advantages are described herein, and will be apparent from the following Detailed Description and the figures.

BRIEF DESCRIPTION OF THE FIGURES

FIG. 16A is a diagram illustrating a state in which Application Example 7 is closed.

DETAILED DESCRIPTION

Some embodiments of the present disclosure will be described in detail below in the following order with reference to the accompanying drawings.

1. First Embodiment
(Top-emission organic EL display unit provided with a transparent layer in contact with only a top surface of a lower electrode layer)
2. Second Embodiment
(Top-emission Organic EL display unit provided with a transparent layer in contact with the lower electrode layer and a base)
3. Third Embodiment
(Bottom-emission organic EL display unit)
4. Application Examples
5. Examples

FIRST EMBODIMENT

[Configuration of Display Unit 1]

Figure 1:
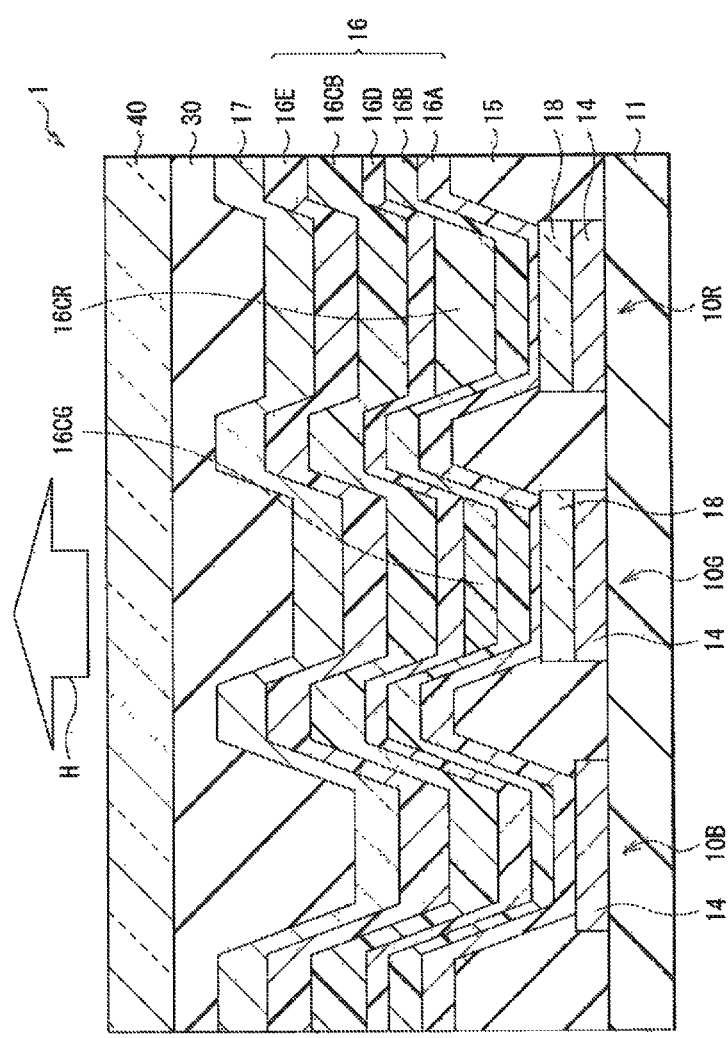
FIG. 1 is a sectional view illustrating a main-part configuration example of a display unit according to a first embodiment of the present disclosure.
Figure 2:
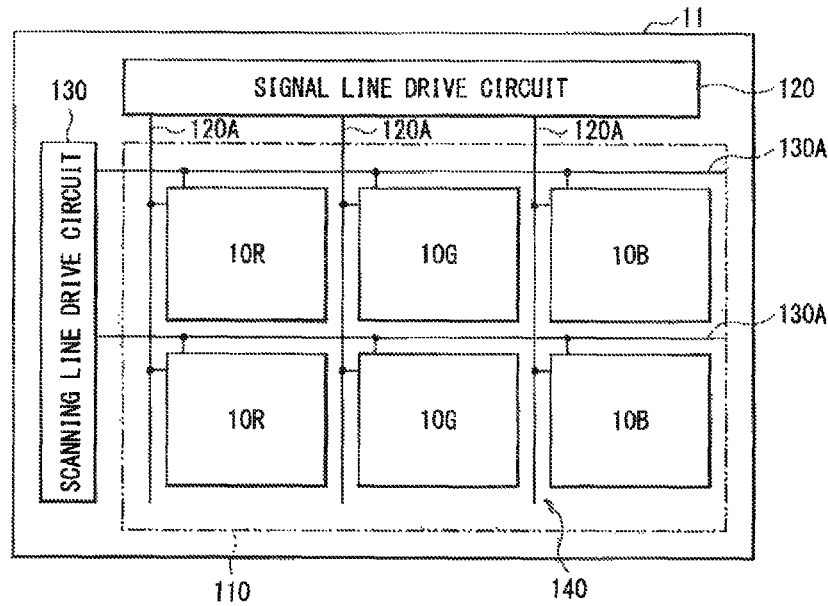
FIG. 2 is a plan view illustrating an entire configuration example of the display unit illustrated in FIG. 1.

FIG. 1 is a sectional view illustrating a main-part configuration example of an organic EL display unit (a display unit 1) according to a first embodiment of the present disclosure. FIG. 2 is a plan view illustrating an entire configuration example of the display unit 1. FIG. 1 illustrates a sectional configuration of a display region 110 illustrated in FIG. 2.

The display unit 1 is used as, for example but not limited to, an organic EL television. For example, as illustrated in FIG. 2, the display unit 1 may include the display region 110 in which a plurality of red organic EL devices 10R, a plurality of green organic EL devices 10G, and a plurality of blue organic EL device 10B (hereinafter collectively referred to as "organic EL devices 10") are provided in a matrix on a substrate 11 as a base. A signal line drive circuit 120 and a scanning line drive circuit 130 as drivers for image display are provided around the display region 110.

Figure 3:
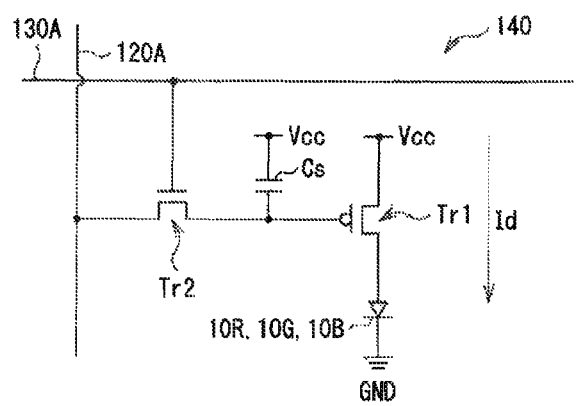
FIG. 3 is a diagram illustrating an example of a pixel drive circuit illustrated in FIG. 1.

A pixel drive circuit 140 is provided in the display region 110. FIG. 3 illustrates an example of the pixel drive circuit 140. The pixel drive circuit 140 may be an active drive circuit formed below a lower electrode layer 14 that will be described later. In other words, the pixel drive circuit 140 includes a driving transistor Tr1, a writing transistor Tr2, a capacitor (a retention capacitor) Cs disposed between the transistors Tr1 and Tr2, and the red organic EL device 10R (or the green organic EL device 10G or the blue organic EL device 10B) connected in series to the driving transistor Tr1 between a first power supply line (Vcc) and a second power supply line (GND). Each of the driving transistor Tr1 and the writing transistor Tr2 may be configured of a typical thin film transistor (TFT), and may have, for example, but not exclusively, an inverted stagger configuration (a so-called bottom gate configuration) or a stagger configuration (a top gate configuration).

In the pixel drive circuit 140, a plurality of signal lines 120A are provided along a column direction, and a plurality of scanning lines 130A are provided along a row direction. An intersection of each signal line 120A and each scanning line 130A corresponds to one (one sub-pixel) of the red organic EL device 10R, the green organic EL device 10G, and the blue organic EL 10B. Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130A.

Moreover, in the display region 110, the red organic EL devices 10R that emit red light, the green organic EL devices 10G that emit green light, and the blue organic EL devices 10B that emit blue light are provided in order in a matrix as a whole. It is to be noted that a combination of the red organic EL device 10R, the green organic EL device 10G, and the blue organic EL device 10B that are adjacent to one another configures one pixel.

As illustrated in FIG. 1, each of the red organic EL devices 10R, the green organic EL devices 10G, and the blue organic EL devices 10B has a configuration in which the lower electrode layer 14, a partition wall 15, an organic layer 16 including a light-emitting layer 16C (16CR, 16CG, or 16CB) that will be described later, and an upper electrode layer 17 are laminated in this order on the substrate 11 with the driving transistor Tr1 of the pixel drive circuit 140 and a planarization insulating film (not illustrated) in between. The display unit 1 is a so-called top emission organic EL display unit in which light emitted from the light-emitting layer 16C of the organic layer 16 passes through the upper electrode layer 17 disposed opposite to the substrate 11 to be extracted to outside as light H.

All of the organic EL devices 10 are covered with a protective layer 30. Moreover, a sealing substrate 40 made of, for example but not limited to, glass is bonded onto an entire surface of the protective layer 30 with an adhesive layer (not illustrated) made of, for example but not limited to a thermosetting resin or a ultraviolet curable resin in between to seal the organic EL devices 10.

The substrate 11 is a supporting body with a main surface on which the red organic EL devices 10R, the green organic EL devices 10G, and the blue organic EL device 10B are formed in an array. As the substrate 11, for example, quartz, glass, silicon, metal foil, or a film or a sheet made of a resin may be used. In particular, quartz and glass may be preferable, and in a case of the film or the sheet made of the resin, materials of the resin may include methacrylate resins typified by poly(methyl methacrylate) (PMMA), polyesters such as polyethylene terephthalate (PET), polyethylene naphthalate (PEN), and polybutylene naphthalate (PBN), and a polycarbonate resin; however, in this case, to suppress water permeability and gas permeability, it is necessary to have a laminated configuration and to perform surface treatment.

The lower electrode layer 14 is provided on the substrate 11 for each of the red organic EL devices 10R, the green organic EL devices 10G, and the blue organic EL devices 10B. The lower electrode layer 14 may have a thickness of, for example, 10 nm to 1000 nm both inclusive. The lower electrode layer 14 may be formed of, for example, a simple substance or an alloy of a metal element such as chromium (Cr), gold (Au), platinum (Pt), nickel (Ni), copper (Cu), tungsten (W), or silver (Ag). In a case where the lower electrode layer 14 is used as a cathode, the lower electrode layer 14 may be desirably made of a material with a high hole injection property. However, even a material, such as an aluminum (Al) alloy, in which a hole injection barrier caused by the presence of an oxide film on a surface thereof or a small work function is an issue is allowed to be used as the lower electrode layer 14 by providing an appropriate hole injection layer 16A. Since the lower electrode layer 14 exhibits a function as a reflective layer, the lower electrode layer 14 may be desirably made of, for example but not limited to, Al or Ag with superior light reflectivity and may desirably have a reflectivity of 40% or more.

One or more kinds of the organic EL devices 10, for example, the red organic EL devices 20R and the green organic EL devices 10G each include a transparent conductive layer 18 between the lower electrode layer 14 and the organic layer 16. The transparent conductive layer 18 is in contact with the lower electrode layer 14 and the organic layer 16. The transparent conductive layer 18 may be made of, for example, a transparent conductive material such as In—Sn—O (indium tin oxide), In—Zn—O (indium zinc oxide), In—O (indium oxide), Zn—O (zinc oxide), and Al—Zn—O (aluminum zinc oxide). The thickness of the transparent conductive layer 18 may be, for example, from 5 nm to 100 nm both inclusive. In this case, the transparent conductive layer 18 in the red organic EL device 10R and the transparent conductive layer 18 in the green organic EL device 10G may be made of a material of the same kind and may have an equal thickness, because it is possible to collectively form them, and manufacturability is superior.

The partition wall 15 is configured to secure insulation between the lower electrode layer 14 and the upper electrode layer 17 and to form a light emission region into a desired shape. Moreover, the partition wall 15 has a function as a partition used when coating by, for example but not limited to, ink-jet printing or nozzle coating is performed in a manufacturing process. The partition wall 15 may be configured by providing an upper layer made of a photosensitive resin such as positive photosensitive polybenzoxazole or positive photosensitive polyimide on a lower layer made of an inorganic insulating material such as $SiO_2$. In the partition wall 15, an opening is provided corresponding to the light emission region.

The organic layer 16 of the red organic EL device 10R may be configured, for example, by laminating a hole injection layer 16A, a hole transport layer 16B, the red light-emitting layer 16CR, an intermediate layer 16D, the blue light-emitting layer 16CB, and an electron transport layer 16E in order on the lower electrode layer 14. The organic layer 16 of the green organic EL device 10G may be configured, for example, by laminating the hole injection layer 16A, the hole transport layer 16B, the green light-emitting layer 16CG, the intermediate layer 16D, the blue light-emitting layer 16CB, and the electron transport layer 16E in order on the lower electrode layer 14. The organic layer 16 of the blue organic EL device 10B may be configured, for example, by laminating the hole injection layer 16A, the hole transport layer 16B, the intermediate layer 16D, the blue light-emitting layer 16CB, the blue light-emitting layer 16CB, and the electron transport layer 16E in order on the lower electrode layer 14. In this case, the blue light-emitting layer 16CB is a common light-emitting layer provided to all of the red organic EL devices 10R, the green organic El devices 10G, and the blue organic EL devices 10B. On the other hand, the green light-emitting layer 16CG is an individual light-emitting layer provided only for the green organic EL device 10G, and the red light-emitting layer 16CR is an individual light-emitting layer provided only for the red organic EL device 10R. Moreover, each of the hole injection layer 16A, the hole transport layer 16B, the intermediate layer 16D, and the electron transport layer 16E may be a common layer provided for all of the organic EL devices 10R, the green organic EL devices 10G, and the blue organic EL devices 10B.

The hole injection layer 16A is configured to enhance hole injection efficiency to each of the light-emitting layers 16C (the red light-emitting layer 16CR, the green light-emitting layer 16CG, and the blue light-emitting layer 16CB). The thickness of the hole injection layer 16A may be preferably, for example, from 5 nm to 100 nm both inclusive, and more preferably from 8 nm to 50 nm both inclusive. A constituent material of the hole injection layer 16A may be appropriately selected in relation to a material of an electrode or an adjacent layer. Examples of the constituent material of the hole injection layer 16A may include polyaniline, polythiophene, polypyrrole, polyphenylene vinylene, polythienylene vinylene, polyquinoline, polyquinoxaline, and derivatives thereof, a conductive polymer such as a polymer including an aromatic amine structure in a main chain or a side chain, metal phthalocyanine (such as copper phthalocyanine), and carbon.

In a case where the material used for the hole injection layer 16A is a polymer material, a weight-average molecular weight (Mw) of the polymer material may be within a range of 5000 to 300000 both inclusive, and may be preferably within a range of about 10000 to about 200000 both inclusive. Moreover, an oligomer with a weight-average molecular weight of about 2000 to about 10000 both inclusive may be used; however, in a case where the hole transport layer 16B, the light-emitting layer 16C, and the like are formed on the hole injection layer 16A, the Mw may be desirably 5000 or more to reliably avoid dissolving the hole injection layer 16A. Further, when the Mw is 300000 or less, gelation of the polymer material is easily avoided.

Examples of a typical conductive polymer used as the constituent material of the hole injection layer 16A may include polydioxythiophene such as polyaniline, oligoaniline, and poly(3,4-ethylenedioxythiophene) (PEDOT). In addition, for example but not limited to, Nafion (trademark) manufactured by H.C. Starck GmbH, a trade name for Liquion (trademark) commercially available in a dissolved state, ELsource (trademark) manufactured by Nissan Chemical Industries, Ltd., and a conductive polymer called Verazol (trademark) manufactured by Soken Chemical & Engineering Co., Ltd. may be used.

The hole transport layer 16B is configured to enhance hole transport efficiency to the light-emitting layers 16C. Examples of a specific material used for the hole transport layer 16B may include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof, heterocyclic conjugated monomers, oligomers, and polymers such as a polysilane-based compound, a vinylcarbazole-based compound, a thiophene-based compound, and an aniline-based compound.

More specific materials may include α-naphthyl phenyl phenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano4, 4,4-tris(3-methylphenylphenylamino)triphenylamine, N,N, N',N'-tetrakis(p-tolyl)p-phenylenediamine, N,N,N',N'-tetraphenyl-4,4'-diaminobiphenyl, N-phenyl carbazole, 4-di-p-tolylaminostilbene, poly(paraphenylene vinylene), and poly(thiophenevinylene), poly(2,2'-thienylpyrrole); however, the specific material is not limited thereto.

More preferably, low-molecular-weight materials represented by the following expressions (1) to (3) may be adopted. These materials configured by the general expressions may be used in a monomolecular state or in an oligomer in which a plurality of monomers are linked.

[Chem. 1]
(Each of A1 to A3 is an aromatic hydrocarbon group, a heterocyclic group, or a derivative thereof.)
[Chem. 2]
(Z is a nitrogen-containing hydrocarbon group or a derivative thereof. L1 is a group in which one to four divalent aromatic ring groups are bonded, specifically, a divalent group in which one to four aromatic rings are linked, or a derivative thereof. Each of A4 and A5 is an aromatic hydrocarbon group or an aromatic heterocyclic group, or a derivative thereof. However, A4 and A5 may be bonded to each other to form a cyclic structure.)
[Chem. 3]
(L2 is a group in which two to six divalent aromatic ring groups are bonded. Specifically, L2 is a divalent group in which two to six aromatic rings are linked, or a derivative thereof. Each of A6 to A9 is a group in which one to ten aromatic hydrocarbon groups, one to ten heterocyclic groups, or one to ten derivatives thereof are bonded.)

Each of A1 to A3 in the expression (1) may have an extended structure in which a plurality of rings are linked by a conjugated bond, and may preferably have 30 or less carbon atoms in total. Moreover, substituted groups bonded to these aromatic hydrocarbon groups or heterocyclic groups may include hydrogen, a halogen, a hydroxyl group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a cyano group, a nitro group, and a substituted or unsubstituted amino group with 30 or less carbon atoms. Specific examples of the compound represented by the expression (1) may include compounds represented by the following expressions (1-1) to (1-48).

[Chem. 4]
[Chem. 5]
[Chem. 6]

Specific examples of the compound represented by the expression (2) may include compounds represented by the following expressions (2-1) to (2-69). It is to be noted that as the nitrogen-containing hydrocarbon group bonded to L1, for example, a compound containing a carbozole group or an indole group is adopted; however, the nitrogen-containing hydrocarbon group is not limited thereto. For example, an imidazole group may be used.

[Chem. 7]
[Chem. 8]
[Chem. 9]
[Chem. 10]
[Chem. 11]

Specific examples of the compound represented by the expression (3) may include compounds represented by the following expressions (3-1) to (3-45).

[Chem. 12]
[Chem. 13]
[Chem. 14]
[Chem. 15]

Figure 4:
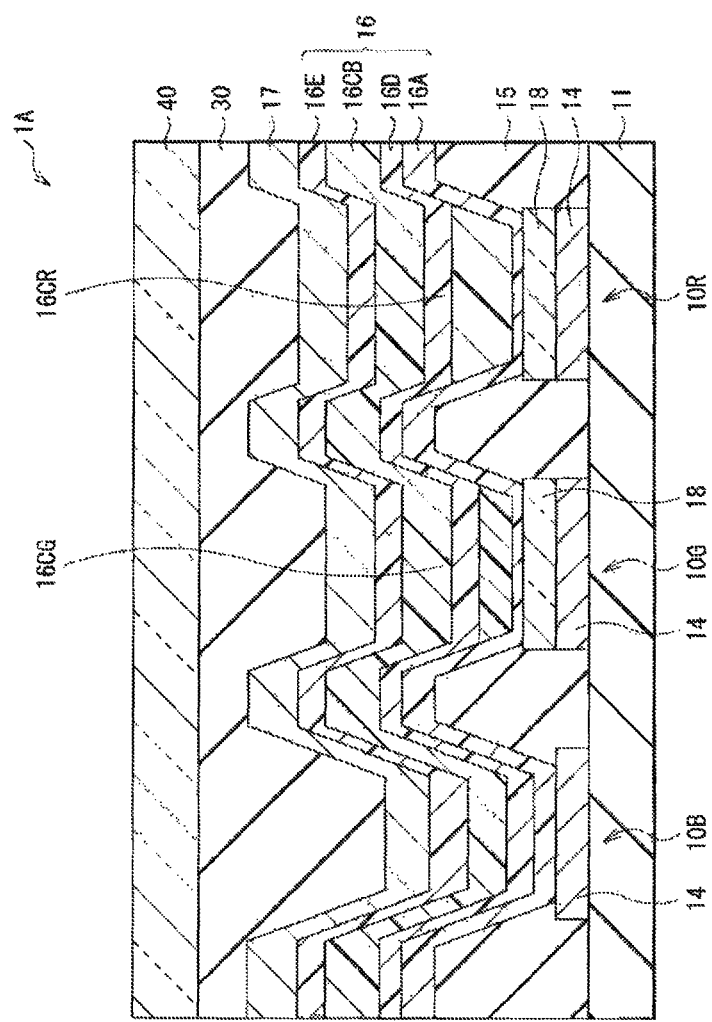
FIG. 4 is a sectional view illustrating a modification example of the display unit illustrated in FIG. 1.

Moreover, a configuration without the hole transport layer 16 such as a display unit 1A as a modification example illustrated in FIG. 4 may be adopted. In this case, the hole injection layer 16A is in contact with the lower electrode layer 14, and is in contact with the intermediate layer 16D, or the green light-emitting layer 16CG or the red light-emitting layer 16CR.

The red light-emitting layer 16CR and the green light-emitting layer 16CG emit light by the recombination of holes and electrons in response to the application of an electric field. Thicknesses of the red light-emitting layer 16CR and the green light-emitting layer 16CG depend on an entire device configuration, but may be preferably, for example, from 10 nm to 200 nm both inclusive, and more preferably from 15 nm to 150 nm both inclusive. The red light-emitting layer 16CR and the green light-emitting layer 16CG are made of a mixed material in which a low-molecular-weight material is added to a polymer (light-emitting) material. In this case, it may be preferable that the low-molecular-weight material be a monomer or an oligomer in which 2 to 10 monomers are bonded, and have a weight-average molecular weight of 10000 or less; however, a low-molecular-weight material with a weight-average molecular weight exceeding the above-described range may be adopted.

The red light-emitting layer 16CR and the green light-emitting layer 16CG may be formed by, for example, a coating method such as ink-jet printing. At this time, the polymer material and the low-molecular-weight material may be dissolved with use of, for example, one or more kinds of organic solvents such as toluene, xylene, anisole, cyclohexanone, mesitylene (1,3,5-trimethylbenzene), pseudocumene (1,2,4-trimethylbenzene), dihydrobenzofuran, 1,2,3,4-tetramethylbenzene, tetralin, cyclohexylbenzene, 1-methylnaphthalene, p-anisylalcohol, dimethylnaphthalene, 3-methylbiphenyl, 4-methylbiphenyl, 3-isopropylbiphenyl, and mono-isopropyl naphthalene to form a mixed solution, and the red light-emitting layer 16CR and the green light-emitting layer 16CG may be formed with use of the mixed solution.

Examples of the polymer material forming the red light-emitting layer 16CR and the green light-emitting layer 16CG may include light-emitting polymers such as a polyfluorene-based polymer derivative, a polyphenylene vinylene derivative, a polyphenylene derivative, a polyvinylcarbazole derivative, and a polythiophene derivative. Examples of a polymer light-emitting layer in which light is emitted from a singlet exciton may include a trade name for ADS111RE (trademark; an expression (4-1)) manufactured by American Dye Source, Inc. for the red light-emitting layer 16CR and a trade name for ADS109GE (trademark; an expression (4-2)) manufactured by American Dye Source, Inc. for the green light-emitting layer 16CG. It is to be noted that the polymer material used here may include not only conjugated polymers but also pendant-form unconjugated polymers and dye-doped unconjugated polymers, and may include a recently developed dendrimer polymer light-emitting material configured of a core molecule provided in a center and a side chain called dendron. Moreover, a substituted group contained in the polymer material is not limited, and the polymer material may contain a substituted group having an electron transport property and/or a hole transport property, as necessary, in a main skeleton represented by an expression (4-1) or an expression (4-2). Moreover, light emission parts may include a light emission part that emits light from a singlet exciton, a light emission part that emits light from a triplet exciton, and a light emission part that emits light from both the singlet exciton and the triplet exciton, and the light-emitting layer 16 according to this embodiment may include any of the light emission parts.

[Chem. 16]

Further, light-emitting units other than the above-described units may include aromatic hydrocarbon such as anthracene, naphthalene, phenanthrene, pyrene, tetracene, coronene, chrysene, fluorecein, perylene, phthaloperylene, naphthaloperylene, perinone, phthaloperinone, naphthaloperinone, diphenylbutadiene, tetraphenylbutadiene, coumarinoxadiazole, aldazine, bisbenzoxazolin, bisstyryl, pyrazine, cyclopentadiene, a quinoline metal complex, an aminoquinoline metal complex, a benzoquinoline metal complex, imine, diphenylethylene, vinylanthracene, diaminocarbazole, pyran, thiopyran, polymethine, merocyanine, an imidazole-chelated oxinoid compound, quinacridone, and rubrene, and heteocyclic compounds. Moreover, a light-emitting unit involving a triplet excited state may be used. Most of the light-emitting unit involving the triplet excited state are compounds containing a metal complex such as an iridium metal complex; however, the light-emitting unit involving the triplet excited state and the contained metal complex are not limited thereto. Specific examples of the polymer light-emitting material that emits light in the triplet excited state may include RPP (an expression (5-1)) as a red phosphorescent light-emitting material and GPP (an expression (5-2)) as a green phosphorescent light-emitting material.

[Chem. 17]

Moreover, a low-molecular-weight material may be preferably added to the polymer material forming the red light-emitting layer 16CR and the green light-emitting layer 16CG. This leads to an improvement in injection efficiency of holes and electrons to the red light-emitting layer 16CR and the green light-emitting layer 16CG. The principle thereof will be described below.

The blue light-emitting layer 16CB made of a low-molecular-weight material is formed as a common layer above the red light-emitting layer 16CR and the green light-emitting layer 16CG that are made of only a polymer material, and a difference between energy levels of the red light-emitting layer 16CR and the green light-emitting layer 16CG and the energy level of the blue light-emitting layer 16CB is large. Accordingly, injection efficiency of holes or electrons between the blue light-emitting layer 16CB and each of the red light-emitting layer 16CR and the green light-emitting layer 16CG is extremely low, and, as described above, there is an issue that intrinsic characteristics of the light-emitting layer made of the polymer material are not allowed to be obtained sufficiently. Therefore, in this embodiment, a low-molecular-weight material (a monomer or an oligomer) allowing a difference between the energy levels of the red light-emitting layer 16CR and the green light-emitting layer 16CB and the energy level of the blue light-emitting layer 16CB to be reduced may be added to the red light-emitting layer 16CR and the green light-emitting layer 16CG to improve a hole injection property and an electron injection property. In this case, consideration is given to a relationship among the highest occupied molecular orbital (HOMO) levels and the lowest unoccupied molecular orbital (LUMO) levels of the red light-emitting layer 16CR and the green light-emitting layer 16CR, the HOMO (Highest Occupied Molecular Orbital) level and the LUMO (Lowest Unoccupied Molecular Orbital) level of the blue light-emitting layer 16CB, and the HOMO (Highest Occupied Molecular Orbital) level and the LUMO (Lowest Unoccupied Molecular Orbital) level of the low-molecular-weight material added to the red light-emitting layer 16CR and the green light-emitting layer 16CG. More specifically, a compound satisfying both (A) a condition that a LUMO value thereof is deeper than that of the red light-emitting layer 16CR or the green light-emitting layer 16CG and is shallower than that of the blue light-emitting layer 16CB and (B) a condition that a HOMO value thereof is deeper than that of the red light-emitting layer 15CR or the green light-emitting layer 16CG and is shallower than that of the blue light-emitting layer is selected.

Moreover, the low-molecular-weight material added to the red light-emitting layer 16CR and the green light-emitting layer 16CB is a compound having substantially a single molecular weight other than compounds configured of molecules of a polymer or a condensate with a high molecular weight produced by continuously repeating identical or similar reaction by a low-molecular-weight compound. Further, a new chemical bond between molecules is not caused by heating in the above-described low-molecular-weight material, and the above-described low-molecular-weight material remains in a monomolecular form. Such a low-molecular-weight material may preferably have a weight-average molecular weight (Mw) of 10000 or less. Moreover, a ratio of a molecular weight of a polymer material to a molecular weight of the low-molecular-weight material may be preferably equal to or larger than 10. The reason for this is that a material with a small molecular weight to some extent has various properties, compared to a material with a large molecular weight, for example, 50000 or more, and is easily adjustable for hole or electron mobility, a band gap, solubility in a solvent, and the like. In a case where a mixture ratio of the polymer material:the low-molecular-weight material is less than 10:1, an effect caused by addition of the low-molecular-weight material is lowered. Moreover, in a case where the mixture ratio exceeds 1:2, it is difficult to obtain the properties that the polymer material as a light-emitting material has. For this reason, the mixture ratio may be preferably 10:1 to 1:2 both inclusive.

As described above, carrier balance between holes and electrons are adjusted more easily by adding the low-molecular-weight material to the red light-emitting layer 16CR and the green light-emitting layer 16CG. Thus, declines in electron injection properties and hole transport properties to the red light-emitting layer 16CR and the green light-emitting layer 16CG caused by forming the blue light-emitting layer 16CB made of the low-molecular-weight material that will be described later are suppressed. In other words, declines in light emission efficiency and lifetime of the red organic EL device 10R and the green organic EL device 10G, a rise in the drive voltage, and change in light-emitting chromaticity are suppressed. As such a low-molecular-weight material, for example, the above-described material forming the hole transport layer 16B may be used.

Moreover, as the low-molecular-weight material added to the red light-emitting layer 16CR and the green light-emitting layer 16CG, a compound having electron transport ability may be used. More specifically, a benzimidazole derivative (an expression (6)), a pyridylphenyl derivative (an expression (7)), and a bipyridine derivative (an expression (8)) represented by the following expressions (6) to (8) may be adopted; however, the low-molecular-weight material is not limited thereto.

[Chem. 18]

(A1 is a hydrogen atom or a halogen atom, an alkyl group with 1 to 20 carbon atoms, a hydrocarbon group with 6 to 60 carbon atoms having a polyaromatic hydrocarbon group in which 3 to 40 aromatic rings are condensed, a nitrogen-containing heterocyclic hydrocarbon group, or a derivative thereof. B is a single bond, a divalent aromatic ring group, or a derivative thereof. Each of R1 and R2 is independently a hydrogen atom, a halogen atom, an alkyl group with 1 to 20 carbon atoms, an aromatic hydrocarbon group with 6 to 60 carbon atoms, a nitrogen-containing heterocyclic group, an alkoxy group with 1 to 20 carbon atoms, or a derivative thereof)

[Chem. 19]

(A2 is an n-valent group in which 2 to 5 aromatic rings are condensed. More specifically, A2 is an n-valent acene-based aromatic ring group in which three aromatic rings are condensed, or a derivative thereof. Each of R3 to R8 is independently a hydrogen atom, a halogen atom, or a free valence bonded to A2 or one of R9 to R13. Each of R9 to R13 is independently a hydrogen atom, a halogen atom, or a free valence bonded to one of R3 to R8. "n" is an integer of 2 or more, and, an n-number of pyridylphenyl groups may be the same as or different from one another.)

[Chem. 20]

(A3 is an m-valent group in which 2 to 5 aromatic rings are condensed. More specifically, A3 is an m-valent acene-based aromatic ring group in which three aromatic rings are condensed, or a derivative thereof. Each of R14 to 18 is independently a hydrogen atom, a halogen atom, or a free valence bonded to A3 or one of R19 to R23. Each of R19 to R23 is independently a hydrogen atom, a halogen atom, or a free valence bonded to one of R14 to R18. "m" is an integer of 2 or more, and an m-number of bipyridyl groups may be the same as or different from one another.)

It is to be noted that the low-molecular-weight material added to the red light-emitting layer 16CR, the green light-emitting layer 16CG, and the blue light-emitting layer 16CB is not limited to one kind, and a mixture of a plurality of kinds of low-molecular-weight materials may be used.

The intermediate layer 16D is inserted between the green light-emitting layer 16CG and the red light-emitting layer 16CR, and the blue light-emitting layer 16CB, and is made of a material with a hole transport property. Thus, color separation is made. It is to be noted that the intermediate layer 16D may have a single-layer configuration or a multilayer configuration configured of a plurality of layers.

The blue light-emitting layer 16CB is configured to emit light by the recombination of electrons and holes in response to the application of an electric field, and is provided on an entire surface of the intermediate layer 16D. The blue light-emitting layer 16CB is formed of an anthracene compound as a host material doped with a blue or green fluorescent dye as a guest material, and thus emits blue or green emission light.

As the host material forming the blue light-emitting layer 16CB, a compound represented by the following expression (9) may be preferably used as the host material.

[Chem. 21]

(Each of R1 to R6 is a hydrogen atom, a halogen atom, a hydroxyl group, an alkyl group with 20 or less carbon atoms, an alkenyl group, a group having a carbonyl group, a group having a carbonyl ester group, a group having an alkoxyl group, a group having a cyano group, a group having a nitro group, or a derivative thereof, a group having a silyl group with 30 or less a carbon atoms, a group having an aryl group, a group having a heterocyclic group, a group having an amino group, or a derivative thereof.)

Examples of the group having the aryl group in R1 to R6 of the compound represented by the expression (9) may include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, and a p-t-butylphenyl group.

Moreover, the group having the heterocyclic group in R1 to R6 is a five- or six-membered ring aromatic ring group containing an oxygen atom (O), a nitrogen atom (N), and a sulfer atom (S) as hetero atoms, and a condensed polycyclic aromatic ring group with 2 to 20 carbon atoms is adopted. Examples of such a heterocyclic group may include a thienyl group, a furyl group, a pyrrolyl group, a pyridyl group, a quinolyl group, a quinoxalyl group, an imidazopyridyl group, and a benzothiazole group. Representative examples may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, and a 9-acridinyl group.

The group having the amino group in R1 to R6 may be any of, for example but not limited to, an alkylamino group, an arylamino group, and an aralkylamino group. They may preferably include an aliphatic hydrocarbon group with 1 to 6 carbon atoms and/or one to four aromatic ring groups. Such groups may include a dimethylamino group, a diethylamino group, a dibutylamino group, a diphenylamino group, a ditolylamino group, a bisbiphenylylamino group, and a dinaphthylamino group. It is to be noted that the above-described substituted group may form a condensed ring configured of 2 or more substituted groups, and a derivative of the condensed ring may be adopted.

Specific examples of the compound represented by the expression (9) may include compounds represented by the following expressions (9-1) to (9-51).

[Chem. 22]
[Chem. 23]
[Chem. 24]

On the other hand, as a light-emitting guest material forming the blue light-emitting layer 16CB, a material with high light emission efficiency, for example, a low-molecular-weight fluorescent material, a phosphorescent dye, or an organic light-emitting material such as a metal complex may be used.

Herein, the blue light-emitting guest material refers to a compound having a peak in a light emission wavelength range of about 400 nm to about 490 nm both inclusive. As such a compound, organic materials such as a naphthalene derivative, an anthracene derivative, a naphthacene derivative, a styrylamine derivative, and a bis(azinyl)methene boron complex are used. In particular, the blue light-emitting guest material may be preferably selected from an aminonaphthalene derivative, an aminoanthracene derivative, an aminochrysene derivative, an aminopyrene derivative, a styrylamine derivative, and a bis(azinyl)methene boron complex.

The electron transport layer 16E is configured to enhance electron transport efficiency to the red light-emitting layer 16CR, the green light-emitting layer 16CG, and the blue light-emitting layer 16CB, and is provided as a common layer on an entire surface of the blue light-emitting layer 16CB. The electron transport layer 16E is in contact with both the blue light-emitting layer 16CB and the upper electrode layer 17. A thickness of the electron transport layer 16E depends on the entire device configuration, but may be preferably, for example, from 5 nm to 300 nm both inclusive, and more preferably from 10 nm to 200 nm both inclusive.

As a material of the electron transport layer 16E, an organic material having superior electron transport ability may be preferably used. Changes in emission colors in the red organic EL device 10R and the green organic EL device 10G by an electric field strength that will be described later are suppressed by enhancing electron transport efficiency to the light-emitting layer 16C, specifically, the red light-emitting layer 16CR and the green light-emitting layer 16CG. As such an organic material, in particular, a nitrogen-containing heterocyclic derivative with an electron mobility of $10^{-6}$ $cm^2/Vs$ to $1.0 \times 10^{-1}$ $cm^2/Vs$ both inclusive may be used.

Specific materials of the electron transport layer 16E may include the benzimidazole derivative (the expression (6)), the pyridylphenyl derivative (the expression (7)), and the bipyridine derivative (the expression (8)) represented by the above-described expressions (6) to (8).

It is to be noted that the organic material used for the electron transport layer 16E may be preferably, but not exclusively, a compound having an anthracene skeleton such as the above-described compound. For example, a benzimidazole derivative, a pyridylphenyl derivative, or a bipyridine derivative having a pyrene skeleton or a chrysene skeleton instead of the anthracene skeleton may be used. Moreover, the organic material used for the electron transport layer 16E is not limited to one kind, and a mixture or a laminate of a plurality of kinds of organic materials may be used.

Emission light H generated in the light-emitting layers 16C (16CR, 16CG, and 16CB) have light emission intensity in red, green, and blue wavelength regions, respectively. The organic layer 16 may desirably have maximum light emission intensity in all of wavelength regions of red, green, and blue that are desired to be extracted and small light emission intensity in an unnecessary wavelength region. The organic EL display unit 1 with high extraction efficiency of light in a necessary light emission region and high color purity is obtained by using such an organic layer 16. It is important to specifically set the film thickness of the organic layer 16 so as to allow a portion between the lower electrode layer 14 and the upper electrode layer 17 to serve as a resonant section that resonates a target wavelength.

Moreover, in each of the organic EL devices 10 (10R, 10G, and 10B), the lower electrode layer 14, the organic layer 16, and the upper electrode layer 17 configures a micro-resonator. An optical distance L as a spacing between the lower electrode layer 14 and the upper electrode layer 17 is set to a value at which light in a desired wavelength region set in each of the organic EL devices 10 (10R, 10G, and 10B) resonates between both ends of the resonant section. Therefore, in a case where, for example, a phase shift occurring when emission light h emitted from the light-emitting layer 16C is reflected at both ends of the resonant section is φ radian, an optical distance of the resonant section is L, a peak wavelength of a spectrum of light H that is desired to be extracted of the emission light h emitted from the light-emitting layer 16C is λmax, the optical distance L of the resonant section is configured within a range satisfying the following mathematical expression (2). In this case, in order to have maximum extraction efficiency of the light H, it is necessary to set L so as to satisfy m, since m in the mathematical expression (2) is a positive integer.

$$(2L)/\lambda\max + \Phi/2\pi = m \qquad (2)$$

where L is an optical distance of the resonant section,

λmax is a peak wavelength of the light H that is to be extracted to outside, and Φ is a phase shift occurring upon reflection at both ends of the resonant section of the micro-resonator, and m is a positive integer.

Moreover, in order to prevent a short circuit between the upper electrode layer 17 and the lower electrode layer 14, it is necessary to increase the thickness of the organic layer 16; therefore, it is necessary to have a large optical distance L. In this case, m is increased to increase the optical distance L. Therefore, the optical distance L of the organic layer 16 is increased by setting m to 1 or more. However, the wavelengths of red, green, and blue are different from one another; therefore, the optical distance L is also different for each kind of the organic EL device 10. Even though the optical distance L is different, it is necessary to set m to an equal value, and in a case where m in red is $m_R$, m in green is $m_G$, and m in blue is $m_B$, the optical distances L for respective colors are set so as to have $m_R = m_G = m_B$. The lower electrode layer 14 and the upper electrode layer 17 are fixed, and a wavelength λ that is desired to be extracted (for example, red λ=630 nm, green λ=530 nm, and blue λ==460 nm) is fixed by each of the organic EL devices 10R, 10G, and 10B. Accordingly, m in the mathematical expression (2) is defined by the optical distance L. More specifically, in organic light-emitting device 10, the distance between the lower electrode layer 14 and the upper electrode layer 17 is narrowed (the optical distance L is decreased) with a decrease in the wavelength λ of an emission color of the organic light-emitting device 10.

The upper electrode layer 17 may have, for example, a thickness of 2 nm to 15 nm both inclusive, and may be configured of a conductive film with light transparency. More specifically, in a case where the upper electrode layer 17 is used as a cathode, a conductive material with a large work function such as Ni, Ag, Au, Pt, palladium (Pd), selenium (Se), rhodium (Rh), ruthenium (Ru), iridium (Ir), rhenium (Re), W, molybdenum (Mo), Cr, tantalum (Ta), niobium (Nb), and alloys thereof, and SnOx, ITO, ZnOx, and TiO may be adopted. Moreover, in a case where the upper electrode layer 17 is used as an anode, an active metal such as lithium (Li), Mg, and calcium (Ca) and a conductive material with a small work function such as an alloy of a metal such as Ag, Al, and indium (In) may be adopted. Moreover, a configuration in which the above-described metal and the above-described conductive material are laminated may be adopted. Further, an electron injection layer may be inserted between the upper electrode layer 17 and the electron transport layer 16E.

Furthermore, the upper electrode layer 17 may be configured of a mixture layer including an organic light-emitting material such as an aluminum quinoline complex, a styrylamine derivative, or a phthalocyanine derivative. In this case, the upper electrode layer 17 may separately include, as a third layer, a layer with light transparency such as MgAg. It is to be noted that, in a case of an active matrix drive system, the upper electrode layer 17 is formed in a solid film form on the substrate 11 while being insulated from the lower electrode layer 14 by the organic layer 16 and the partition wall 15, thereby being used as a common electrode for the red organic EL devices 10R, the green organic EL devices 10G, and the blue organic EL devices 10B. Since the display unit 1 is a top emission display unit, light from the organic layer 16 passes through the upper electrode layer 17 to be extracted to outside, and light transmittance is adjusted by, for example but not limited to, the film thickness. Moreover, the reflectivity of the upper electrode layer 17 may be preferably 0.1% or more and less than 50%. Thus, the resonance intensity of the micro-resonator configuration falls in an appropriate condition, and color selectivity and light intensity of front-extracted light of the display unit 1 are increased, and viewing angle dependence of luminance and chromaticity is allowed to be kept low.

The protective layer 30 may have, for example, a thickness of 2 μm to 3 μm both inclusive, and may be made of an insulating material or a conductive material. As the insulating material, an inorganic amorphous insulating material, for example, amorphous silicon (α-Si), amorphous silicon carbide (α-SiC), amorphous silicon nitride (α-$Si_{1-x}N_x$), or amorphous carbon (α-C) may be preferable. Since such an inorganic amorphous insulating material does not form grains, the inorganic amorphous insulating material has low water permeability, and forms a favorable protective film.

The sealing substrate 40 is disposed closer to the upper electrode layer 17 of the red organic EL devices 10R, the green organic EL devices 10G, and the blue organic EL devices 10B, and is configured to seal, together with an adhesive layer (not illustrated), the red organic EL devices 10R, the green organic EL devices 10G, and the blue organic EL devices 10B. The sealing substrate 40 is made of a material, such as glass, transparent to light generated by the red organic EL devices 10R, the green organic EL devices 10G, and the blue organic EL devices 10B. For example, a color filter and a light-shielding film as a black matrix (both not illustrated) may be provided on the sealing substrate 40.

The color filter includes a red filter, a green filter, and a blue filter (all not illustrated) that are disposed corresponding to each of the red organic EL devices 10R, each of the green organic EL devices 10G, and each of the blue organic EL devices 10B, respectively. The red filter, the green filter, and the blue filter may be closely formed in a rectangular shape. Each of the red filter, the green filter, and the blue filter is made of a resin mixed with a pigment, and is adjusted by selecting the pigment so as to have high light transmittance in a wavelength region of target red, green, or blue and low light transmittance in other wavelength regions.

Moreover, the wavelength range in which transmittance is high in the color filter and the peak wavelength λ of a spectrum of light that is desired to be extracted from the resonator configuration are equal to each other. Therefore, only light with a wavelength equal to the peak wavelength λ of the spectrum of the light that is desired to be extracted of outside light entering from the sealing substrate 40 passes through the color filter, and outside light with the other wavelengths is prevented from entering the organic EL devices 10R, 10G, and 10B of respective colors.

The light-shielding film may be configured of, for example, a black resin film that is mixed with a black colorant and has optical density of 1 or more, or a thin film filter using interference of a thin film. In particular, the light-shielding film may be preferably configured of the black resin film, thereby allowing the light-shielding film to be formed easily at low cost. The thin film filter may be configured, for example, by laminating one or more thin films made of a metal, a metal nitride, or a metal oxide, and is configured to attenuate light with use of interference of the thin film. Specifically, a thin film filter configured by alternately laminating chromium (Cr) and chromium (III) oxide ($Cr_2O_3$) may be used.

[Method of Manufacturing Display Unit 1]

For example, the display unit 1 may be manufactured as follows. A method of manufacturing the display unit 1 will be described below referring to FIG. 5 in addition to FIGS. 1 and 2.

Figure 5:
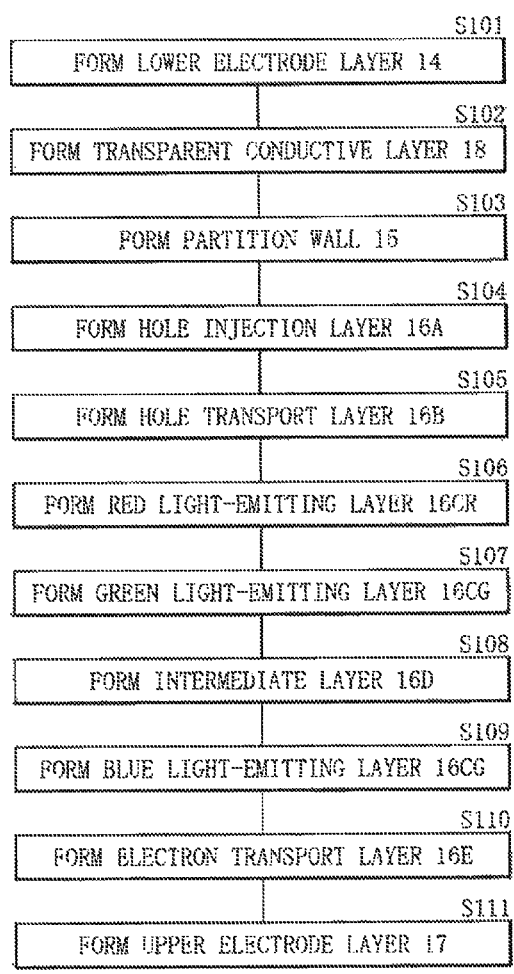
FIG. 5 is a diagram illustrating a flow of a method of manufacturing the display unit illustrated in FIG. 1.

FIG. 5 is a flowchart illustrating a flow of the method of manufacturing the display unit 1. First, the pixel drive circuit 140 including the driving transistor Tr1 is formed on the substrate 11 made of the above-described material, and a planarization insulating film (not illustrated) made of, for example, a photosensitive resin may be provided on the pixel drive circuit 140.

(Formation of Lower Electrode Layer 14)

Next, a conductive film made of a predetermined material is formed on an entire surface of the substrate 11, and patterning is performed on the conductive film, thereby forming the lower electrode layer 14 for each of the organic EL devices 10 (step S101). At this time, the lower electrode layer 14 is brought into conduction with the drain electrode of the driving transistor Tr1 through a contact hole (not illustrated) of the planarization insulating film (not illustrated). In the patterning, photolithography technology and etching technology may be used.

(Formation of Transparent Conductive Layer 18)

Next, a transparent conductive film made of a predetermined material is formed to cover the entire substrate 11 and the entire lower electrode layer 14 formed on the substrate 11. Patterning is performed on the transparent conductive film to form the transparent conductive layer 18 having, for example, the same planar shape as that of the lower electrode layer 14 for each of the organic EL devices 10 (step S102). However, the transparent conductive layer 18 is formed only on the lower electrode layer 14 of the red organic EL device 10R and the lower electrode layer 14 of the green organic EL device 10G. In the patterning, photolithography technology and etching technology may be used.

(Formation of Partition Wall 15)

Next, an insulating film made of an inorganic insulating material such as $SiO_2$ is formed on the lower electrode layer 14 and the planarization insulating film (not illustrated) by, for example, a CVD (Chemical Vapor Deposition) method. After that, patterning is performed on the insulating film with use of photolithography technology and etching technology to form the partition wall 15 (step S103).

After the partition wall 15 is formed, a surface where the lower electrode layer 14 and the partition wall 15 are formed of the substrate 11 may be subjected to oxygen plasma treatment to remove contaminants such as an organic matter adhered to the surface, thereby improving wettability. More specifically, the substrate 11 is heated at a predetermined temperature, for example, from about 70° C. to about 80° C. both inclusive, and then is subjected to plasma treatment using oxygen as reactant gas ($O_2$ plasma treatment) under atmospheric pressure.

(Formation of Hole Injection Layer 16A and Hole Transport Layer 16B)

After water-repellent treatment is performed, the hole injection layer 16A and the hole transport layer 16B are sequentially formed as common layers to cover the entire surface (step S104 and step S105). The hole injection layer 16A and the hole transport layer 16B may be formed by a coating method such as a spin coating method, a droplet discharging method, or a slit coating method, a method using a shadow mask, or a printing method. After coating, heat treatment (dry treatment) may be performed.

(Formation of Red Light-Emitting Layer 16CR and Green Light-Emitting Layer 16CG)

After the hole injection layer 16A and the hole transport layer 16B are formed, the red light-emitting layer 16CR and the green light-emitting layer 16CG are selectively formed in predetermined positions (step S106 and step S107). The red light-emitting layer 16CR and the green light-emitting layer 16CG are formed by a coating method such as a spin coating method, a droplet discharging method, or a slit coating method, a method using a shadow mask, or a printing method. In particular, since it is necessary to selectively provide formation materials of the red light-emitting layer 16CR and the green light-emitting layer 16CG in regions enclosed with the partition wall 15, an ink-jet printing as a droplet discharging method or a nozzle coating method may be preferably used.

(Formation of Intermediate Layer 16D)

After the red light-emitting layer 16CR and the green light-emitting layer 16CG are formed, the intermediate layer 16D is formed with use of a material with a hole transport property as a common layer to cover the entire surface (step S108).

(Formation of Blue Light-Emitting Layer 16CB, Electron Transport Layer 16E, and Upper Electrode Layer 17)

After the intermediate layer 16D is formed, the blue light-emitting layer 16CB, the electron transport layer 16E, and the upper electrode layer 17 are sequentially formed as common layers with use of respective predetermined materials by, for example, an evaporation method to cover the entire surface (steps S109 to S111).

(Formation of Protective Layer 30)

After the upper electrode layer 17 is formed, the protective layer 30 is formed by, for example, an evaporation method or a CVD method. For example, in a case where the protective layer 30 made of amorphous silicon nitride is formed, the protective layer 30 is formed with a thickness of 2 μm to 3 μm both inclusive by the CVD method. At this time, it may be desirable that, in order to prevent a decline in luminance due to degradation of the organic layer 16, a film formation temperature be set to ordinary temperature, and in order to prevent peeling of the protective layer, film formation be performed under a condition that stress on a film is minimized.

The intermediate layer 16D, the blue light-emitting layer 16CB, the electron transport layer 16E, the upper electrode layer 17, and the protective layer 30 are formed as solid films on the entire surface without using a mask. Moreover, they may be desirably formed sequentially in a same film formation apparatus without being exposed to the air. Accordingly, degradation of the organic layer 16 caused by atmospheric moisture is prevented.

After the protective layer 30 is formed, for example, the light-shielding film made of the above-described material is formed on the sealing substrate 40 made of the above-described material. Next, the sealing substrate 40 is coated with the material of the red filter (not illustrated) by spin coating or any other method, and the material is subjected to patterning by photolithography technology, and is fired to form the red filter. Next, the blue filter (not illustrated) and the green filter (not illustrated) are sequentially formed in a similar manner to the red filter (not illustrated).

After that, the adhesive layer (not illustrated) is formed on the protective layer 30, and the sealing substrate 40 is bonded onto the protective layer 30 with the adhesive layer in between. Thus, the display unit 1 is completed.

In this display unit 1, the scanning signal is supplied from the scanning line drive circuit 130 to each pixel through the gate electrode of the writing transistor Tr2, and the image signal from the signal line drive circuit 120 is retained in the retention capacitor Cs through the writing transistor Tr2. In other words, on-off control of the driving transistor Tr1 is performed in response to the signal retained in the retention capacitor Cs, and a drive current Id is thereby injected into the red organic EL devices 10R, the green organic EL devices 10G, and the blue organic EL devices 10B to allow the red organic EL devices 10R, the green organic EL devices 10G, and the blue organic EL devices 10B to emit light by the recombination of holes and electrons. In a case of bottom emission, this light passes through the lower electrode layer 14 and the substrate 11 to be extracted, and in a case of top emission, this light passes through the upper electrode layer 17, the color filter (not illustrated), and the sealing substrate 40 to be extracted.

[Functions and Effects of Display Unit 1]

As described above, in the display unit 1 according to this embodiment, the organic layer 16 provided between the lower electrode layer 14 and the upper electrode layer 17 includes the blue light-emitting layer 16CB as a common light-emitting layer, and the green light-emitting layer 15CG and the red light-emitting layer 16CR as individual light-emitting layers. Therefore, compared to a case where the light-emitting layers for all organic EL light-emitting devices are configured of only a common light-emitting layer, light emission efficiency and chromaticity are improved. Moreover, in the green organic EL device 10G and the red organic EL device 10R, the transparent conductive layer 18 is provided between the lower electrode layer 14 and the organic layer 16. Therefore, the optical film thickness L is allowed to be adjusted by the thicknesses of the green light-emitting layer 16CG and the red light-emitting layer 16CR as individual light-emitting layers and the thickness of the transparent conductive layer 18, and compared to a case where the transparent conductive layer 18 is not provided, the thicknesses of the individual light-emitting layers are allowed to be decreased. As a result, in the display unit 1, while superior display performance is assured by color separation of the light-emitting layer 16C, it is possible to reduce power consumption by decreasing the thickness of the light-emitting layer 16C.

However, in a case where the optical film thickness L is adjusted only by the thickness of the light-emitting layer 16C without providing the transparent conductive layer, the thickness of the light-emitting layer 16C largely differs according to a difference in color of light that is to be extracted. Therefore, it is necessary for the thickness of the red light-emitting layer 16CR that emits desired color light, for example, red light to be much larger than that of the blue light-emitting layer 16CB. Typically, power consumption for driving of the light-emitting layer is increased with an increase in the thickness of the light-emitting layer. Therefore, an actually selectable range of the thickness of the light-emitting layer is limited. On the other hand, in this embodiment, the thickness of the light-emitting layer 16C is allowed to be reduced by the thickness of the transparent conductive layer 18; therefore, this embodiment is advantageous in terms of low power consumption.

It is to be noted that in order to adjust the optical film thickness L, the thickness of the transparent conductive layer 18 provided on the lower electrode layer 14 may be appropriately selected and adjusted according to the emission color of the organic EL device 10. However, in this case, it is necessary to perform patterning for each emission color of the organic EL device 10.

Moreover, in the display unit 1 according to this embodiment, the transparent conductive layer 18 is not provided in the blue organic EL device 10B. This is because, as indicated by the above-described mathematical expression (2), in a case where m is equal, the wavelength of blue light is the shortest.

SECOND EMBODIMENT

[Configuration of Display Unit 2]

Figure 6:
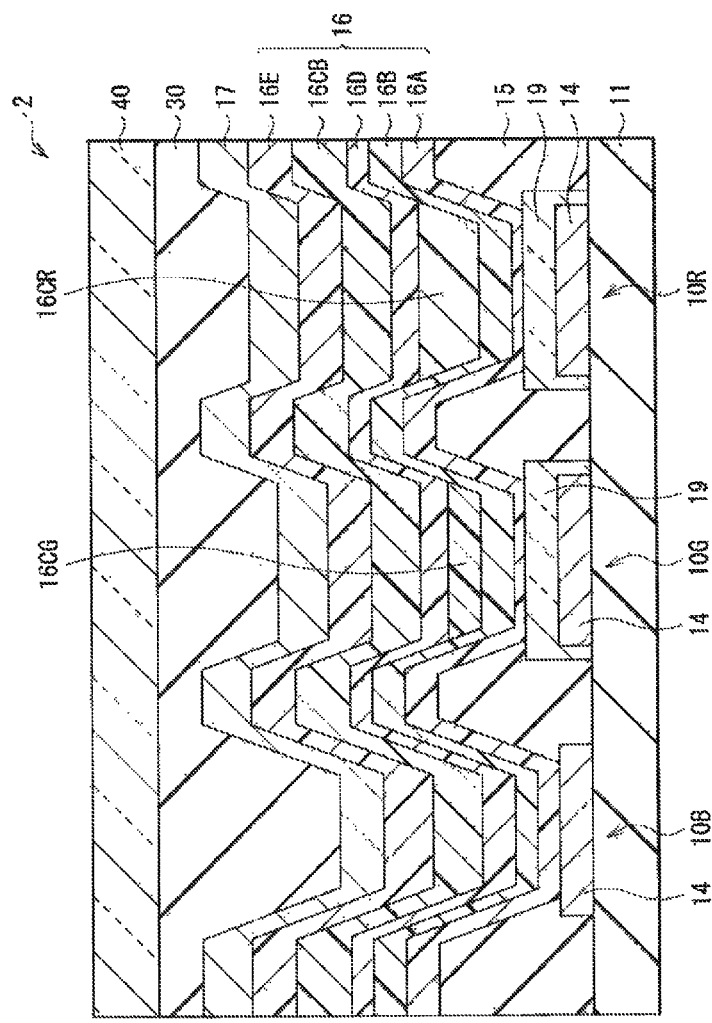
FIG. 6 is a sectional view illustrating a main-part configuration example of a display unit according to a second embodiment of the present disclosure.

FIG. 6 is a sectional view illustrating a main-part configuration example of a display unit (a display unit 2) according to a second embodiment of the present disclosure.

The display unit 2 has a similar configuration to that of the display unit 1, except that the transparent conductive layer 18 is replaced with a transparent conductive layer 19. Therefore, in the following description, in the display unit 2, like components are denoted by like numerals as of the display unit 1, and will not be further described.

The display unit 2 differs from the display unit 1 in that the transparent conductive layer 19 covers not only the top surface of the lower electrode layer 14 but also an end surface thereof, and is in contact with the substrate 11. In this case, the transparent conductive layer 19 is brought into conduction with the drain electrode of the driving transistor Tr1 through the contact hole (not illustrated) of the planarization insulating film (not illustrated). Therefore, the transparent conductive layer 19 substantially functions, together with the upper electrode layer 17, as an electrode that applies a voltage to the organic layer 16 positioned therebetween. On the other hand, the lower electrode layer 14 functions mainly as a reflective layer that reflects light generated in the light-emitting layer 16C.

[Method of Manufacturing Display Unit 2]

Only processes of manufacturing the lower electrode layer 14 and the transparent conductive layer 19 in the display unit 2 will be described below referring to FIGS. 7A to 7F. Other processes are similar to those in the display unit 1 described in the first embodiment.

Figure 7A:
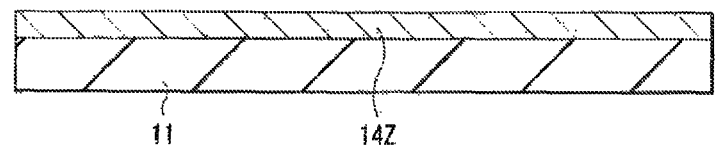
FIG. 7A is a sectional view illustrating a process of a method of manufacturing the display unit illustrated in FIG. 6.

First, after the substrate 11 in which the pixel drive circuit 140 is formed is prepared, a conductive film 14Z made of a predetermined material is formed to cover the entire surface of the substrate 11 (FIG. 7A). The conductive film 14Z is formed by, for example, DC sputtering.

Figure 7B:
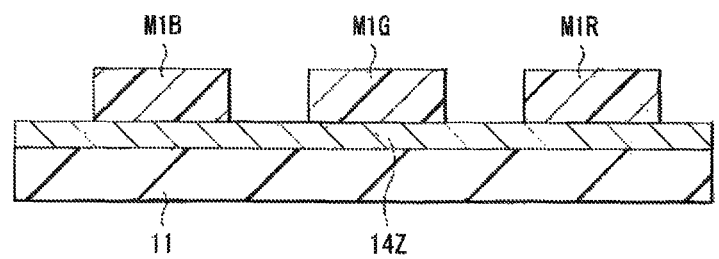
FIG. 7B is a sectional view illustrating a process following FIG. 7A.

Next, mask patterns M1B, M1G, and M1R are formed to cover predetermined regions on the conductive film 14Z (FIG. 7B).

Figure 7C:
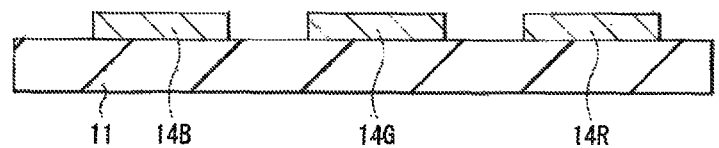
FIG. 7C is a sectional view illustrating a process following FIG. 7B.

After that, an exposed region not covered with the mask patterns M1B, M1G, and M1R of the conductive film 14 is removed by etching, and the mask patterns M1B, M1G, and M1R are lifted off. Thus, a lower electrode layer 14B of the blue organic EL device 10B, a lower electrode layer 14G of the green organic EL device 10G, and a lower electrode layer 14R of the red organic EL device 10R appear in positions corresponding to the mask patterns M1B, M1G, and M1R, respectively (FIG. 7C).

Figure 7D:
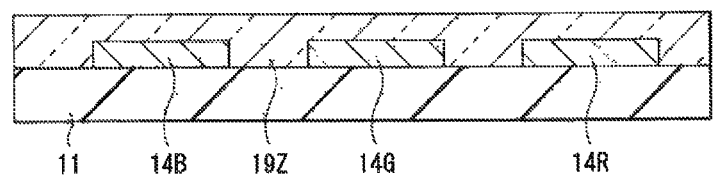
FIG. 7D is a sectional view illustrating a process following FIG. 7C.

Next, a transparent conductive film 19Z made of a predetermined material is formed to cover the whole (FIG. 7D).

Figure 7E:
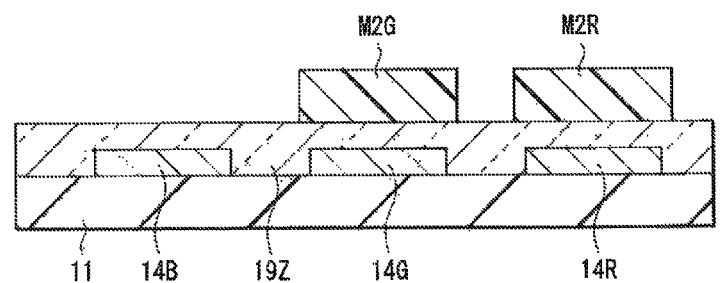
FIG. 7E is a sectional view illustrating a process following FIG. 7D.

Next, mask patterns M2G and M2R are formed to cover regions corresponding to the lower electrode layer 14G and the lower electrode layer 14R, respectively, on the transparent conductive film 19Z (FIG. 7E). At this time, areas occupied by the mask patterns M2G and M2R are slightly larger than areas occupied by the lower electrode layer 14G and the lower electrode layer 14R.

Figure 7F:
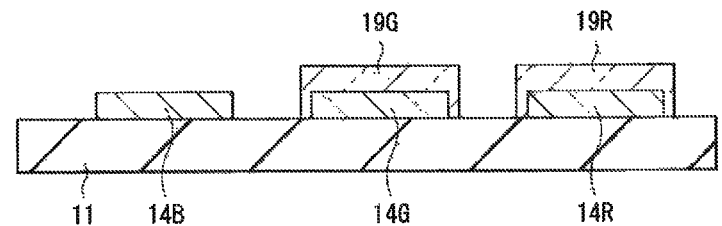
FIG. 7F is a sectional view illustrating a process following FIG. 7E.

After that, an exposed region not covered with the mask patterns M2G and M2R of the transparent conductive film 19Z is removed by etching, and then the mask pattern M2G and M2R are lifted off. Thus, a transparent conductive layer 19G of the green organic EL device 10G and a transparent conductive layer 19R of the red organic EL device 10R appear in positions corresponding to the mask patterns M2G and M2R, respectively (FIG. 7F). At this time, since the mask patterns M2G and M2R are slightly larger than the lower electrode layer 14G and the lower electrode layer 14R, end surfaces of the lower electrode layers 14G and 14R are also covered. In a case where In—Zn—O is used as a constituent material of the transparent conductive film 19Z, the exposed region of the transparent conductive film 19Z is removed by, for example, dry etching processing using a dry etching gas including chlorine gas. Moreover, in a case where the thickness of the transparent conductive film 19Z is large, after the thickness of the transparent conductive film 19Z is reduced to a certain level by wet etching processing, the above-described dry etching processing may be performed. Thus, with use of both wet etching processing and dry etching processing, it is possible to reduce time necessary for dry etching processing, and it is possible to reduce, for example but not limited to, dust generated in the dry etching processing.

[Functions and Effects of Display Unit 2]

As described above, in the display unit 2 according to this embodiment, the transparent conductive layer 19 covers the top surface and the end surface of the lower electrode layer 14, and is in contact with the driving transistor Tr1 of the pixel drive circuit 140 buried in the substrate 11. Therefore, the transparent conductive layer 19 fulfills a function as an electrode that the lower electrode layer 14 serves.

Metal materials with high reflectivity such as Al and Ag used as the lower electrode layer 14 easily form oxide films on their surfaces because of properties thereof. Since these oxide films have relatively high electrical resistance, the oxide films may cause a decline in the function as the electrode carried by lower electrode layer 14. Moreover, the metal materials such as Al and Ag are prone to corrosion by, for example but not limited to, an acid; therefore, during manufacturing, sufficient consideration to surrounding environment of the lower electrode layer 14 is demanded. On the other hand, in this embodiment, the transparent conductive layer 19 made of a transparent conductive material such as ITO that is resistant to change in structure caused by, for example but not limited to, oxidation or corrosion is used as the electrode; therefore, the organic EL device 10 with high reliability is obtained. Further, in a case where Al—Nd is used as the lower electrode layer 14, and ITO is used as the transparent conductive layer 19, an increase in resistance due to contact resistance at an interface therebetween is caused. However, in this embodiment, the transparent conductive layer 19 is allowed to function as an electrode by connecting the driving transistor Tr1 to the transparent conductive layer 19; therefore, an influence of an increase in resistance is avoidable.

THIRD EMBODIMENT

[Configuration of Display Unit 3]

Figure 8:
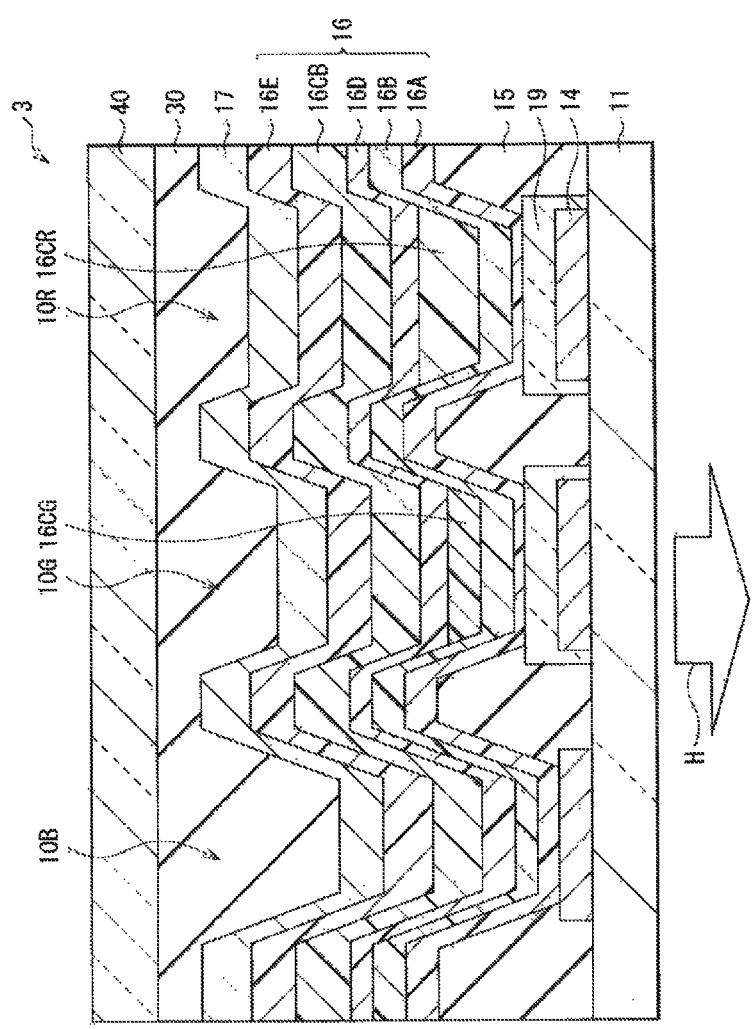
FIG. 8 is a sectional view illustrating a main-part configuration example of a display unit according to a third embodiment of the present disclosure.

FIG. 8 is a sectional view illustrating a main-part configuration example of a display unit (a display unit 3) according to a third embodiment of the present disclosure.

The display unit 3 is a so-called bottom emission organic EL display unit in which light emitted from the light-emitting layer 16C of the organic layer 16 passes through the lower electrode layer 14 and the substrate 11 to be extracted to outside as the light H. Therefore, the lower electrode layer 14 may be made of, for example, a transparent conductive material such as In—Sn—O, In—Zn—O, In—O, Zn—O, and Al—Zn—O. The substrate is made of, for example but not limited to, a transparent resin in addition to quartz or glass with light transparency. On the other hand, the upper electrode layer 17 may be formed of, for example, a simple substance or an alloy of a metal element such as chromium, gold, platinum, nickel, copper, tungsten, or silver, in addition to aluminum, and also has a function as a reflective layer. The display unit 3 has a similar configuration to that of the display unit 1, except for these points. Even in this display unit 3, similar effects to those of the above-described display unit 1 are obtained.

APPLICATION EXAMPLES

Application Examples of the above-described display units (display units 1, 1A, 2, and 3) to electronic apparatuses will be described below. Examples of the electronic apparatuses may include televisions, digital cameras, notebook personal computers, mobile terminal units such as mobile phones, and video cameras. In other words, the above-described display units are applicable to electronic apparatuses, in any fields, that display an image signal inputted from outside or an image signal produced inside as an image or a picture.

[Module]

Figure 9:
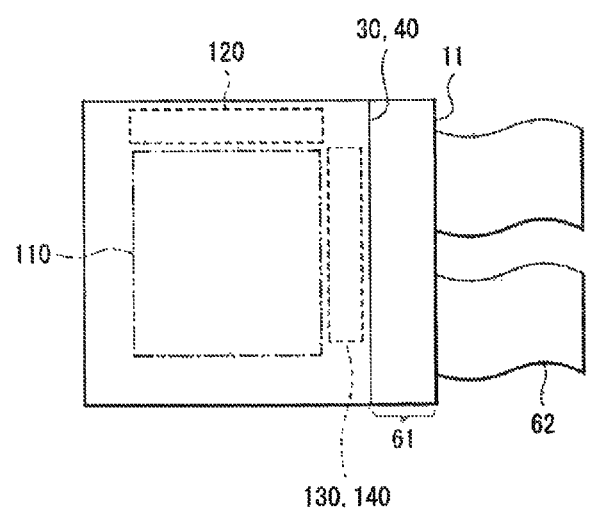
FIG. 9 is a plan view illustrating a schematic configuration of a module including one of the display units according to the first to third embodiments.

The above-described display units may be incorporated as, for example, a module illustrated in FIG. 9 into various electronic apparatuses such as Application Examples 1 to 7 that will be described later. This module may be configured, for example, by providing a region 61 exposed from the sealing substrate 40 or the protective film 30 on one side of the substrate 11 and extending wiring lines of the signal line drive circuit 120, the scanning line drive circuit 130, and power supply line supply circuit 140 to form an external connection terminal (such as first peripheral electrode and a second peripheral electrode). A flexible printed circuit (FPC) 62 for signal input and output may be provided to the external connection terminal Application Example 1

Figure 10A:
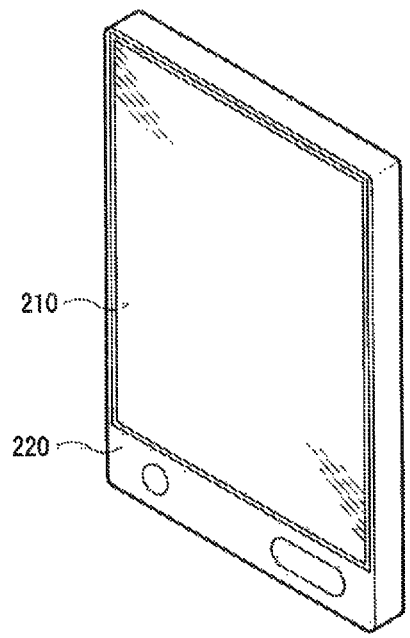
FIG. 10A is a perspective view illustrating an appearance of Application Example 1 of the display units according to the first to third embodiments.
Figure 10B:
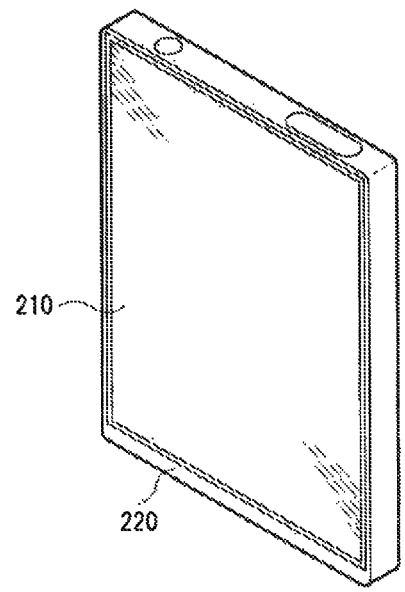
FIG. 10B is another perspective view illustrating an appearance of Application Example 1.

FIGS. 10A and 10B illustrate an appearance of an electronic book to which one of the display units according to the above-described embodiments is applied. The electronic book may include, for example, a display section 210 and a non-display section 220, and the display section 210 is configured of one of the display units according to the above-described embodiments.

Application Example 2

Figure 11:
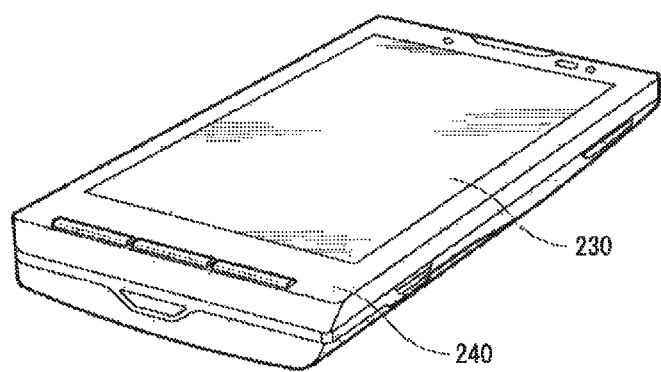
FIG. 11 is a perspective view illustrating an appearance of Application Example 2.

FIG. 11 illustrates an appearance of a smartphone to which one of the display units according to the above-described embodiments is applied. The smartphone may include, for example, a display section 230 and a non-display section 240, and the display section 230 is configured of one of the display units according to the above-described embodiments.

Application Example 3

Figure 12:
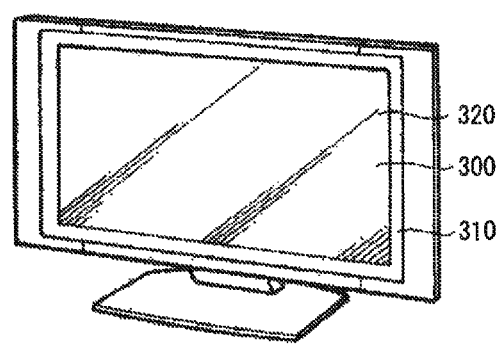
FIG. 12 is a perspective view illustrating an appearance of Application Example 3.

FIG. 12 illustrates an appearance of a television to which one of the display units according to the above-described embodiments is applied. The television may include, for example, an image display screen section 300 including a front panel 310 and a filter glass 320, the image display screen section 300 is configured of one of the display units according to the above-described embodiments.

Application Example 4

Figure 13A:
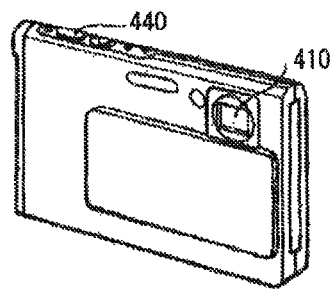
FIG. 13A is a perspective view illustrating an appearance viewed from a front side of Application Example 4.
Figure 13B:
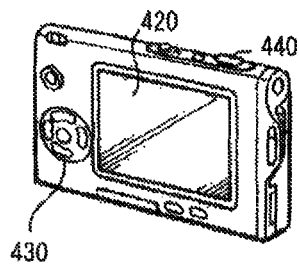
FIG. 13B is a perspective view illustrating an appearance viewed from a back side of Application Example 4.

FIGS. 13A and 13B illustrate an appearance of a digital camera to which one of the display units according to the above-described embodiments is applied. The digital camera may include, for example, a light-emitting section 410 for a flash, a display section 420, a menu switch 430, and a shutter button 440, and the display section 420 is configured of one of the display units according to the above-described embodiments.

Application Example 5

Figure 14:
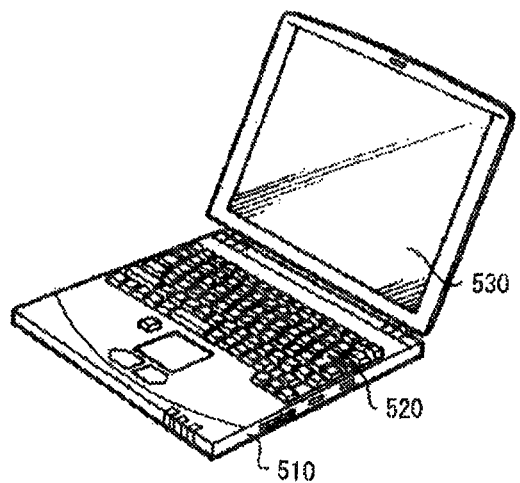
FIG. 14 is a perspective view illustrating an appearance of Application Example 5.

FIG. 14 illustrates an appearance of a notebook personal computer to which one of the display units according to the above-described embodiments is applied. The notebook personal computer may include, for example, a main body 510, a keyboard 520 for operation of inputting, for example but not limited to, characters, and a display section 530 that displays an image, and the display section 530 is configured of one of the display units according to the above-described embodiments.

Application Example 6

Figure 15:
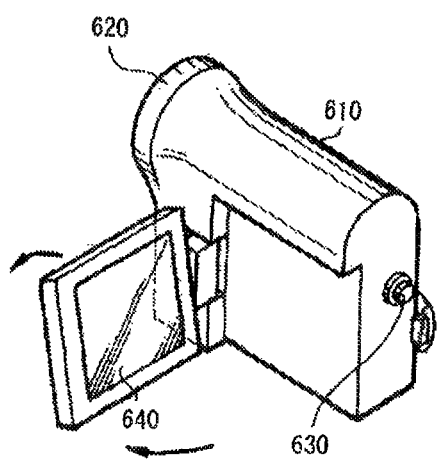
FIG. 15 is a perspective view illustrating an appearance of Application Example 6.

FIG. 15 illustrates an appearance of a video camera to which one of the display units according to the above-described embodiments is applied. The video camera may include, for example, a main body section 610, a lens 620 provided on a front side surface of the main body section 610 and for shooting an image of a subject, a shooting start and stop switch 630, and a display section 640. The display section 640 is configured of one of the display units according to the above-described embodiments.

Application Example 7

Figure 16B:
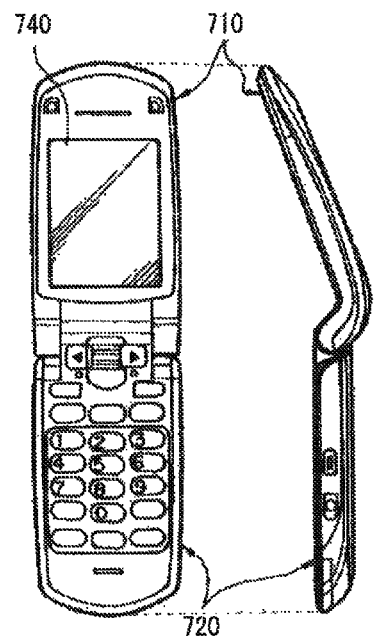
FIG. 16B is a diagram illustrating a state in which Application Example 7 is opened.

FIGS. 16A and 16B illustrate an appearance of a mobile phone to which one of the display units according to the above-described embodiments is applied. The mobile phone may be configured of, for example, a top-side enclosure 710 and a bottom-side enclosure 720 that are connected together through a connection section (hinge section) 730, and the mobile phone may include a display 740, a sub-display 750, a picture light 760, and a camera 770. The display 740 or the sub-display 750 of these components is configured of one of the display units according to the above-described embodiments.

3. EXAMPLES

Examples of the present disclosure will be described in detail below; however, the present technology is not limited to these examples.

Experimental Example 1

Here, the display unit described in the above-described second embodiment was fabricated. A specific fabricating procedure is as follows.

First, the conductive film 14Z (refer to FIG. 7A) made of an aluminum-neodymium alloy (Al—Nd) with a thickness of 200 nm was formed on the substrate 11 by DC sputtering. After that, the conductive film 14Z was patterned into a predetermined shape by a photolithography method to form the lower electrode layer 14 (14B, 14G, and 14R) (refer to FIG. 7C).

Next, the transparent conductive film 19Z made of ITO was formed with a thickness of 20 nm to cover the whole (refer to FIG. 7D). After that, the transparent conductive layers 19G and 19R were formed by a photolithography method to cover the lower electrode layers 14G and 14R (refer to FIG. 7F). At that time, in order to prevent the lower electrode layers 14G and 14R from being exposed, the top surfaces and the end surfaces of the lower electrode layers 14G and 14R were completely covered with the transparent conductive layers 19G and 19R. Moreover, the transparent conductive layers 19G and 19R were brought into conduction with the drain electrode of the driving transistor Tr1 through the contact hole (not illustrated) of the planarization insulating film (not illustrated) in order to prevent an increase in resistance caused by contact resistance at an interface between the lower electrode layers 14G and 14R made of Al—Nd and the transparent conductive layers 19G and 19R made of ITO. It is to be noted that, in the blue organic EL device 10B, the lower electrode layer 14B was brought into conduction with the drain electrode of the driving transistor Tr1.

Next, the surface of the substrate 11 was subjected to oxygen plasma treatment in a vacuum atmosphere at 10 Pa or less to execute cleaning of the surface.

Moreover, the organic layer 6 was formed by the following procedure. First, after the hole injection layer 16A was formed with a thickness of 20 nm by a slit coating method, heating treatment was executed for 30 minutes in an air atmosphere. Next, with use of an ink jetprinting method, the red light-emitting layer 16CR was formed with a thickness of 60 nm in a position corresponding to the lower electrode layer 14R, and the green light-emitting layer 16CG was formed with a thickness of 40 nm in a position corresponding to the lower electrode layer 14G. After that, drying was performed for about 10 minutes in a vacuum atmosphere at about $10^2$ Pa, and baking treatment was performed for 30 minutes at a temperature of 130° C. in a nitrogen atmosphere. Further, in a vacuum, the intermediate layer 13 and the blue light-emitting layer 16CB with a thickness of 20 nm were formed by an evaporation doping method, and the electron transport layer 16E and the electron injection layer made of LiF were sequentially formed.

Finally, after the upper electrode layer 17, the protective layer 12 made of silicon nitride with a thickness of 3 μm were formed, sealing treatment was performed by bonding the sealing substrate 40 made of glass by vacuuming.

Comparative Example 1

Figure 17:
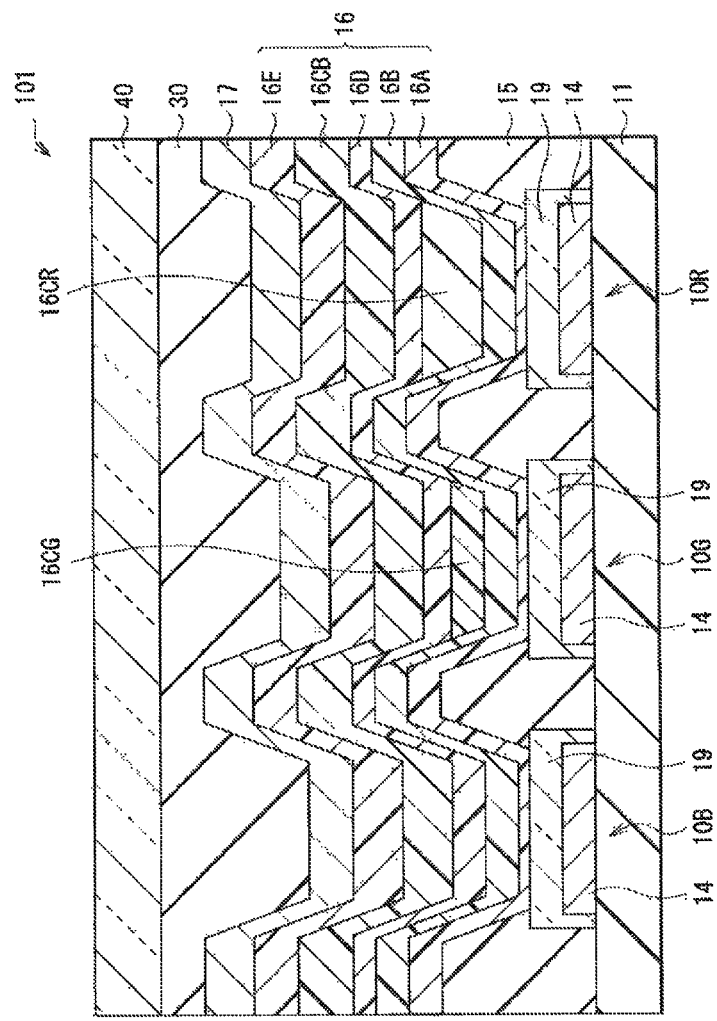
FIG. 17 is a sectional view illustrating a main-part configuration example of a display unit of Comparative Example 1.

As Comparative Example 1, a display unit 101 (FIG. 17) was fabricated in a similar manner to Example 1, except that the transparent conductive layer 19 made of ITO was provided on the lower electrode layers 14 of all of the organic EL devices 10. It is to be noted that, even in the blue organic EL device 10B, a transparent conductive layer 19B covering the lower electrode layer 14B was brought into conduction with the drain electrode of the driving transistor Tr1.

Comparative Example 2

Figure 18:
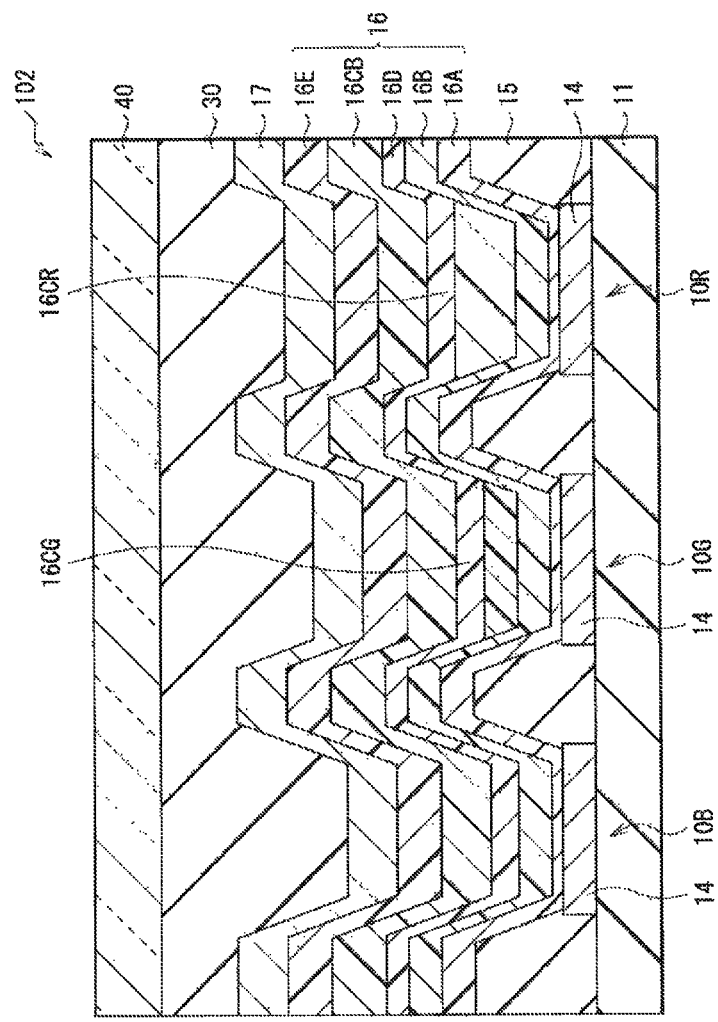
FIG. 18 is a sectional view illustrating a main-part configuration example of a display unit of Comparative Example 2.

As Comparative Example 2, a display unit 102 (FIG. 18) was fabricated in a similar manner to Example 1, except that the transparent conductive layer 19 was not at all provided. It is to be noted that, in all of the organic EL devices 10, the lower electrode layer 14 was brought into conduction with the drain electrode of the driving transistor Tr1.

Figure 19A:
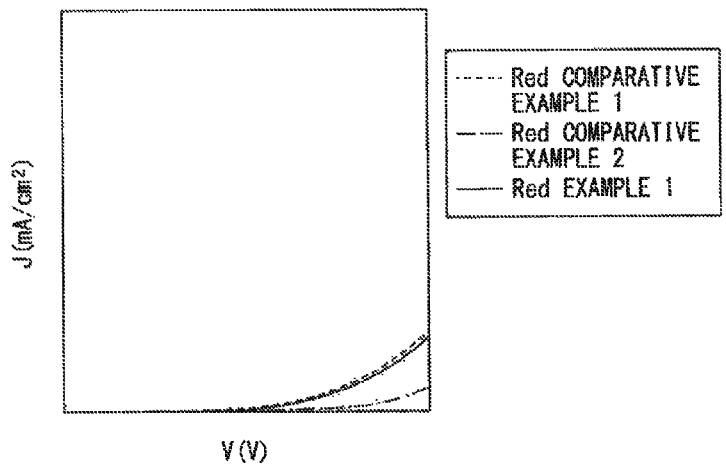
FIG. 19A is a first characteristic diagram illustrating a relationship between a drive voltage and a current density in the display units of Example 1 and Comparative Examples 1 and 2.
Figure 19B:
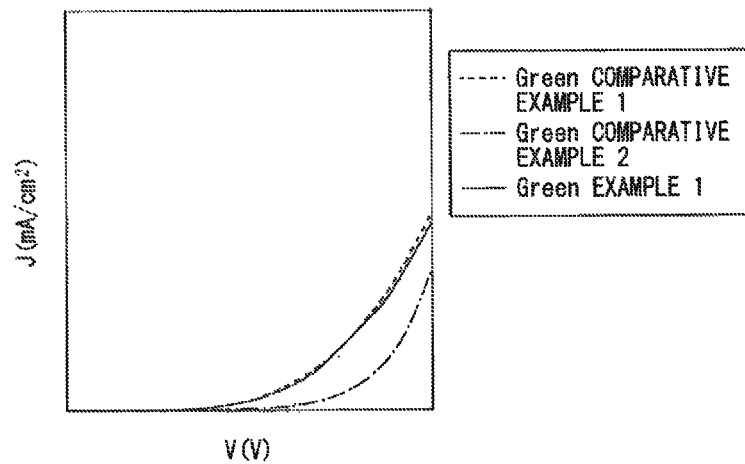
FIG. 19B is a second characteristic diagram illustrating the relationship between the drive voltage and the current density in the display units of Example 1 and Comparative Examples 1 and 2.
Figure 19C:
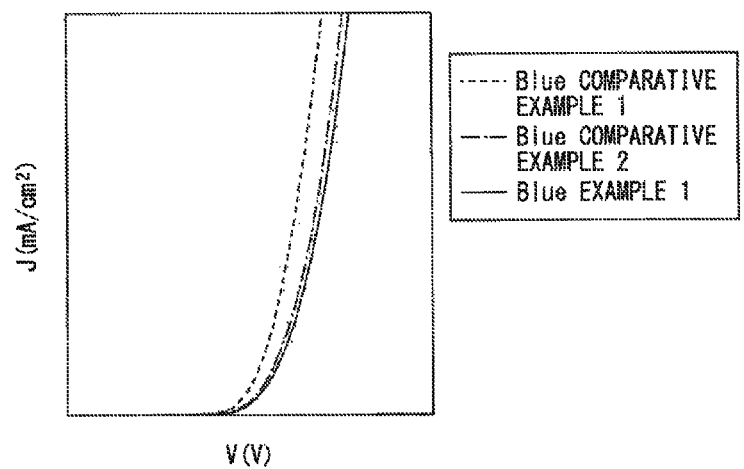
FIG. 19C is a third characteristic diagram illustrating the relationship between the drive voltage and the current density in the display units of Example 1 and Comparative Examples 1 and 2.
Figure 20:
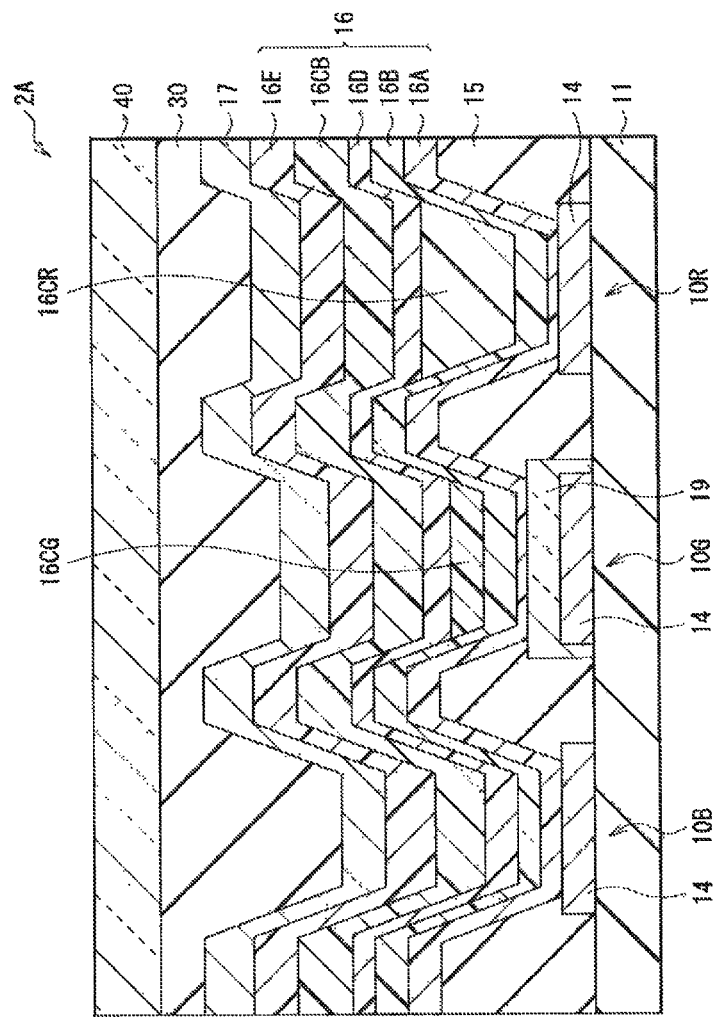
FIG. 20 is a sectional view illustrating a modification example of the display unit illustrated in FIG. 6.
Figure 21:
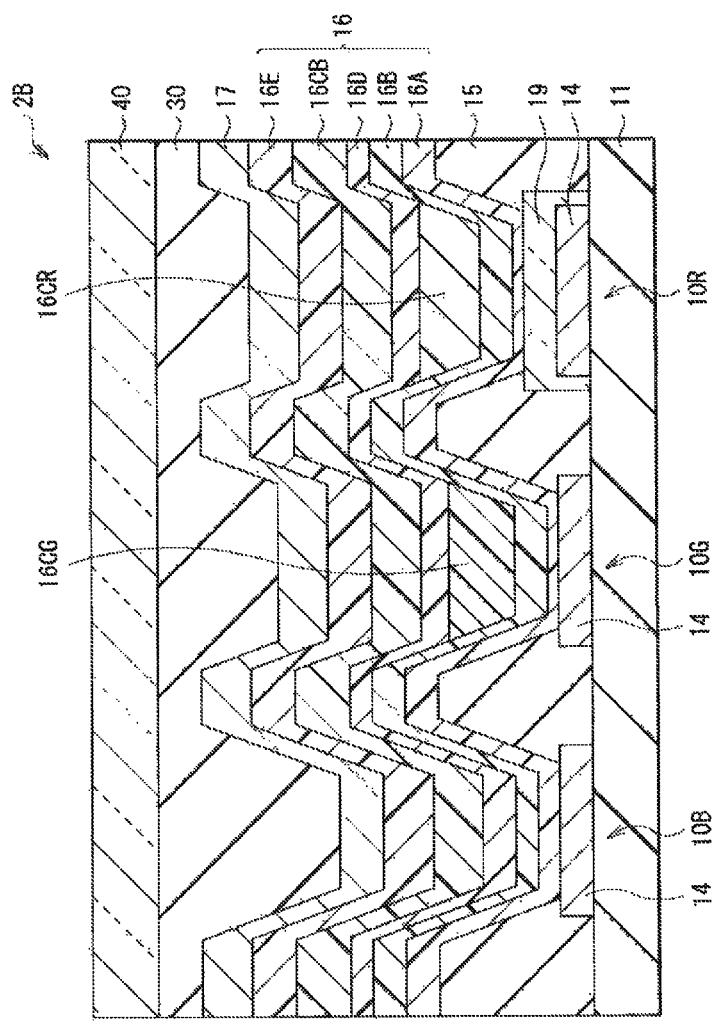
FIG. 21 is a sectional view illustrating another modification example of the display unit illustrated in FIG. 6.

Drive voltages, light emission efficiency (cd/A) during driving at a current density of 10 mA/cm², and chromaticity of the organic EL devices 10 in the display units in Example 1 and Comparative Examples 1 and 2 were measured. Results are illustrated in Table 1 and FIGS. 19A to 19C. In FIG. 19A to 19C, a horizontal axis indicates a drive voltage V (V), a vertical axis indicates current density J (mA/cm²), and their full scales are made uniform, and are standardized. FIGS. 19A, 19B, and 19C illustrate the red organic EL device 10R, the green organic EL device 10G, and the blue organic EL device 10B, respectively.

device 10; however, the present technology is not limited thereto. For example, like a display unit 2A illustrated in FIG. 20 or a display unit 2B illustrated in FIG. 21, the transparent conductive layer 19 may be provided in only the green organic EL device 10G or the red organic EL device 10R.

Moreover, in the above-described embodiments and the like, three kinds, i.e., the red organic EL device, the green organic EL device, and the blue organic EL device are described as examples of the organic light-emitting device; however, the present technology may be applicable to a display unit including an organic light-emitting device that emits light of any other color.

Further, the material and thickness of each layer, the method and conditions of forming each layer are not limited to those described in the above-described embodiments and the like, and each layer may be made of any other material with any other thickness by any other method under any other conditions.

Furthermore, in the above-described embodiments and the like, the active matrix display unit is described: however, the present technology is applicable to a passive matrix display unit. In addition, the configuration of a pixel drive circuit for active matrix drive is not limited to that described in the above-described embodiments, and, if necessary, a capacitor device or a transistor may be further included. In

TABLE 1

|  | Red Organic EL Device | | | Green Organic EL Device | | | Blue Organic EL device | | |
| --- | --- | --- | --- | --- | --- | --- | --- | --- | --- |
|  | Efficiency [cd/A] | Chromaticity CIE-x | Chromaticity CIE-y | Efficiency [cd/A] | Chromaticity CIE-x | Chromaticity CIE-y | Efficiency [cd/A] | Chromaticity CIE-x | Chromaticity CIE-y |
| Example 1 | 15 | 0.65 | 0.35 | 41 | 0.26 | 0.67 | 6.5 | 0.13 | 0.12 |
| Comparative Example 1 | 13 | 0.65 | 0.35 | 42 | 0.26 | 0.67 | 6.1 | 0.14 | 0.09 |
| Comparative Example 2 | 14 | 0.65 | 0.35 | 46 | 0.26 | 0.67 | 6.2 | 0.14 | 0.09 |

In Comparative Example 1, the transparent electrode layer was provided in the organic EL devices of all colors; therefore, chromaticity of emission light H from the blue organic EL device 10B was largely shifted to cause a decline in light emission efficiency.

Moreover, in Comparative Example 2, chromaticity was fine, but compared to Example 1, the film thicknesses of the red light-emitting layer 16CR and the green light-emitting layer 16CG were increased by about 20 nm, thereby greatly increasing the drive voltage for driving of the red organic EL device 10R and the green organic EL device 10G.

On the other hand, in Example 1, while securing superior chromaticity, a reduction in drive voltage was allowed to be achieved. It was confirmed from the results that, according to the present technology, in spite of a simple configuration, both superior color reproductivity and an improvement in light extraction efficiency by a reduction in the drive voltage were achievable by selectively providing the transparent conductive layer 19 in an appropriate position and appropriately controlling the film thickness of the light-emitting layer 16C.

Although the present technology is described referring to the embodiments and modification examples, the present technology is not limited thereto, and may be variously modified. For example, in the above-described embodiments and the like, the transparent conductive layer 19 is provided in the green organic EL device 10G and the red organic EL this case, another drive circuit may be included in addition to the above-described signal line drive circuit 120 and the above-described scanning line drive circuit 130 according to a modification of the pixel drive circuit.

It is to be noted that the present technology is allowed to have following configurations.

(1) An organic EL display unit including:
two or more kinds of organic light-emitting devices, each of the organic light-emitting devices having a laminated configuration in which a first electrode layer, an organic layer, and a second electrode layer are laminated in order on a base, and the organic light-emitting devices configured to emit light of different colors,
in which the organic layer includes a common light-emitting layer and an individual light-emitting layer, the common light-emitting layer shared by all of the kinds of organic light-emitting devices, and the individual light-emitting layer provided in only a kind configured to emit specific color light of the kinds of organic light-emitting devices, and
some of the kinds of organic light-emitting devices each include a transparent conductive layer between the first electrode layer and the organic layer.

(2) The organic EL display unit according to (1), in which
the two or more kinds of organic light-emitting devices include a first light-emitting device configured to emit first color light, a second light-emitting device configured to emit second color light, and a third light-emitting device configured to emit third color light, the first light-emitting device includes, as the individual light-emitting layer, a first light-emitting layer configured to emit the first color light, the second light-emitting device includes, as the individual light-emitting layer, a second light-emitting layer configured to emit the second color light, a third light-emitting layer configured to emit the third color light is provided as the common light-emitting layer, and only both the first light-emitting device and the second light-emitting device, or only the first light-emitting device includes the transparent conductive layer.

(3) The organic EL display unit according to (1) or (2), in which the organic layer includes one or more intermediate layers between the common light-emitting layer and the individual light-emitting layer.

(4) The organic EL display unit according to any one of (1) to (3), in which the individual light-emitting layer is provided between the common light-emitting layer and the first electrode layer.

(5) The organic EL display unit according to any one of (1) to (4), in which the organic layer includes a hole injection layer between the common light-emitting layer and the individual light-emitting layer, and the first electrode layer.

(6) The organic EL display unit according to (5), in which the hole injection layer is in contact with both the individual light-emitting layer and the first electrode layer.

(7) The organic EL display unit according to (5), in which the organic layer includes a hole transport layer between the common light-emitting layer and the individual light-emitting layer, and the hole injection layer.

(8) The organic EL display unit according to any one of (1) to (7), in which the organic layer includes an electron transport layer between the common light-emitting layer and the individual light-emitting layer, and the second electrode layer.

(9) The organic EL display unit according to (8), in which the electron transport layer is in contact with both the common light-emitting layer and the second electrode layer.

(10) The organic EL display unit according to any one of (1) to (9), in which, wherein, in the two or more kinds of organic light-emitting devices, a spacing between the first electrode layer and the second electrode layer is narrowed with a decrease in a wavelength of an emission color.

(11) The organic EL display unit according to any one of (1) to (10), in which the second electrode layer is provided to be shared by all of the kinds of organic light-emitting devices.

(12) The organic EL display unit according to any one of (1) to (11), in which a layer other than the individual light-emitting layer in the organic layer is provided to be shared by all of the organic light-emitting devices.

(13) The organic EL display unit according to (1), in which the two or more kinds of organic light-emitting devices include a red light-emitting device configured to emit red light, a green light-emitting device configured to emit green light, and a blue light-emitting device configured to emit blue light, the red light-emitting device includes a red light-emitting layer as the individual light-emitting layer, the green light-emitting device includes a green light-emitting layer as the individual light-emitting layer, a blue light-emitting layer is provided as the common light-emitting layer, only both the red light-emitting device and the green light-emitting device or only the red light-emitting device includes the transparent conductive layer.

(14) The organic EL display unit according to any one of (1) to (13), in which thicknesses of all of the transparent conductive layers are equal to one another.

(15) The organic EL display unit according to any one of (1) to (14), in which the transparent conductive layer is in contact with the first electrode layer.

(16) The organic EL display unit according to any one of (1) to (15), in which the transparent conductive layer covers a top surface and an end surface of the first electrode layer and is in contact with the base.

(17) The organic EL display unit according to any one of (1) to (14), in which one of the first electrode layer and the second electrode layer has light transparency, and the other of them has light reflectivity.

This application claims the benefit of Japanese Priority Patent Application JP 2013-123637 filed on Jun. 12, 2013, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. An organic EL display unit comprising:
a plurality of organic light-emitting devices including a first organic light-emitting device, a second organic light-emitting device and a third organic light-emitting device, each of the organic light-emitting devices having a laminated configuration in which a first electrode layer, an organic layer, and a second electrode layer are laminated in order on a substrate, and the organic light-emitting devices configured to emit light of different colors,
wherein the organic layer includes at least one of a common light-emitting layer and an individual light-emitting layer, the common light-emitting layer shared by all the first, second and third organic light-emitting device, and the individual light-emitting layer only provided in the second and third organic light-emitting device,
wherein the second and third organic light-emitting devices each include a transparent conductive layer between the first electrode layer and the organic layer, and
wherein the transparent conductive layer is in contact with the substrate.
2. The organic EL display unit according to claim 1, wherein
the individual light-emitting layer includes a first individual light-emitting layer and a second individual light-emitting layer,
wherein the first light-emitting device includes the first individual light-emitting layer configured to emit first color light,
wherein the second light-emitting device includes the second individual light-emitting layer configured to emit second color light,
wherein the third light-emitting layer includes the common light-emitting layer configured to emit third color light, and wherein only both the first light-emitting device and the second light-emitting device, or only the first light-emitting device includes the transparent conductive layer.

3. The organic EL display unit according to claim 1, wherein the organic layer includes one or more intermediate layers between the common light-emitting layer and the individual light-emitting layer.

4. The organic EL display unit according to claim 1, wherein the individual light-emitting layer is provided between the common light-emitting layer and the first electrode layer.

5. The organic EL display unit according to claim 1, wherein the organic layer includes a hole injection layer between the common light-emitting layer and the individual light-emitting layer, and the first electrode layer.

6. The organic EL display unit according to claim 5, wherein the hole injection layer is in contact with both the individual light-emitting layer and the first electrode layer.

7. The organic EL display unit according to claim 5, wherein the organic layer includes a hole transport layer between the common light-emitting layer and the individual light-emitting layer, and the hole injection layer.

8. The organic EL display unit according to claim 1, wherein the organic layer includes an electron transport layer between the common light-emitting layer and the individual light-emitting layer, and the second electrode layer.

9. The organic EL display unit according to claim 8, wherein the electron transport layer is in contact with both the common light-emitting layer and the second electrode layer.

10. The organic EL display unit according to claim 1, wherein a spacing between the first electrode layer and the second electrode layer is narrowed with a decrease in a wavelength of an emission color.

11. The organic EL display unit according to claim 1, wherein the second electrode layer is provided to be shared by all of the organic light-emitting devices.

12. The organic EL display unit according to claim 1, wherein a layer other than the individual light-emitting layer in the organic layer is provided to be shared by all of the organic light-emitting devices.

13. The organic EL display unit according to claim 1, wherein
the organic light-emitting devices include a red light-emitting device configured to emit red light, a green light-emitting device configured to emit green light, and a blue light-emitting device configured to emit blue light,
the red light-emitting device includes a red light-emitting layer as the first individual light-emitting layer,
the green light-emitting device includes a green light-emitting layer as the second individual light-emitting layer,
the blue light-emitting device includes a blue light-emitting layer as the common light-emitting layer,
only both the red light-emitting device and the green light-emitting device or only the red light-emitting device includes the transparent conductive layer, and
the blue light-emitting device excludes the transparent conductive layer.

14. The organic EL display unit according to claim 1, wherein thicknesses of all of the transparent conductive layers are equal.

15. The organic EL display unit according to claim 1, wherein the transparent conductive layer is in contact with the first electrode layer.

16. The organic EL display unit according to claim 1, wherein the transparent conductive layer is provided on a top surface and a side end surface of the first electrode layer.

17. The organic EL display unit according to claim 1, wherein one of the first electrode layer and the second electrode layer has light transparency, and the other of them has light reflectivity.

* * * * *